United States Patent
Hill et al.

(10) Patent No.: US 11,428,642 B2
(45) Date of Patent: Aug. 30, 2022

(54) SCANNING SCATTEROMETRY OVERLAY MEASUREMENT

(71) Applicant: KLA Corporation, Milpitas, CA (US)

(72) Inventors: Andrew V. Hill, Berkeley, CA (US); Amnon Manassen, Haifa (IL)

(73) Assignee: KLA Corporation, Milpitas, CA (US)

(*) Notice: Subject to any disclaimer, the term of this patent is extended or adjusted under 35 U.S.C. 154(b) by 15 days.

(21) Appl. No.: 17/140,999

(22) Filed: Jan. 4, 2021

(65) Prior Publication Data
US 2022/0214285 A1    Jul. 7, 2022

(51) Int. Cl.
*G01N 21/88* (2006.01)
*G01N 21/47* (2006.01)
*G01N 21/95* (2006.01)
*G06T 7/00* (2017.01)

(52) U.S. Cl.
CPC ......... *G01N 21/8851* (2013.01); *G01N 21/47* (2013.01); *G01N 21/8806* (2013.01); *G01N 21/9501* (2013.01); *G06T 7/001* (2013.01); *G01N 2021/8822* (2013.01); *G01N 2201/0633* (2013.01); *G01N 2201/0636* (2013.01); *G01N 2201/06113* (2013.01); *G01N 2201/103* (2013.01); *G06T 2207/30148* (2013.01)

(58) Field of Classification Search
CPC .............. G01N 21/8851; G01N 21/47; G01N 21/8806; G01N 21/9501; G01N 2021/8822; G01N 2201/06113; G01N 2201/0633; G01N 2201/0636; G01N 2201/103; G06T 7/001; G06T 2207/30148
See application file for complete search history.

(56) References Cited

U.S. PATENT DOCUMENTS

| | | | |
|---|---|---|---|
| 10,379,445 B2 | 8/2019 | Jak et al. | |
| 2013/0100427 A1* | 4/2013 | Koolen | G03F 9/70 356/614 |
| 2013/0278942 A1 | 10/2013 | Jeong et al. | |
| 2016/0097727 A1 | 4/2016 | Vazhaeparambil et al. | |

(Continued)

OTHER PUBLICATIONS

U.S. Appl. No. 16/586,504, filed Sep. 27, 2019, Hill et al.
(Continued)

*Primary Examiner* — Jamil Ahmed
(74) *Attorney, Agent, or Firm* — Suiter Swantz pc llo

(57) ABSTRACT

An overlay metrology system may include an illumination sub-system to sequentially illuminate an overlay target with a first illumination lobe and a second illumination lobe opposite the first illumination lobe, where the overlay target includes grating-over-grating features formed from periodic structures on a first sample layer and a second sample layer. The system may further include an imaging sub-system to generate a first image and a second image of the overlay target. The first image includes an unresolved image of the grating-over-grating structures formed from a single non-zero diffraction order of the first illumination lobe. The second image includes an unresolved image of the one or more grating-over-grating structures formed from a single non-zero diffraction order of the second illumination lobe. The system may further include a controller to determine an overlay error between the first layer and the second layer based on the first image and the second image.

29 Claims, 18 Drawing Sheets

(56) References Cited

U.S. PATENT DOCUMENTS

2017/0176871 A1    6/2017    Buel et al.
2018/0373166 A1    12/2018    Sanguinetti et al.
2020/0409271 A1    12/2020    Hill et al.

OTHER PUBLICATIONS

U.S. Appl. No. 16/996,328, filed Aug. 18, 2020, Hill et al.
PCT International Search Report and Written Opinion for International Application No. PCT/US2021/065166 dated Apr. 22, 2022, 9 pages.

\* cited by examiner

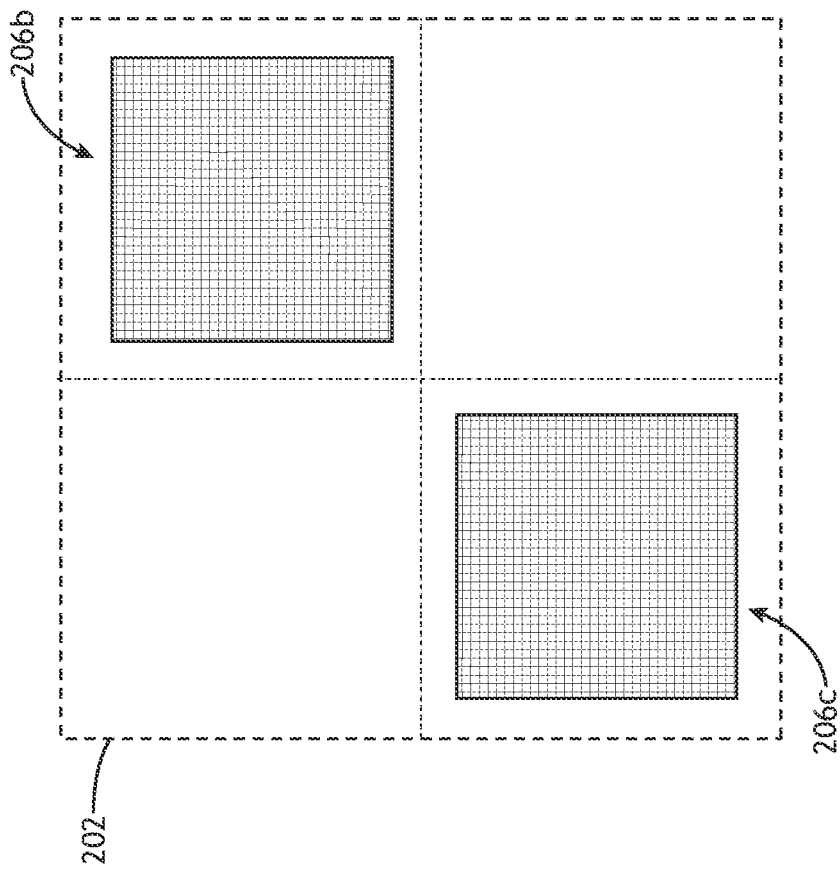
FIG. 5B
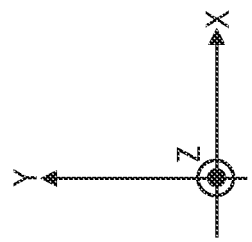

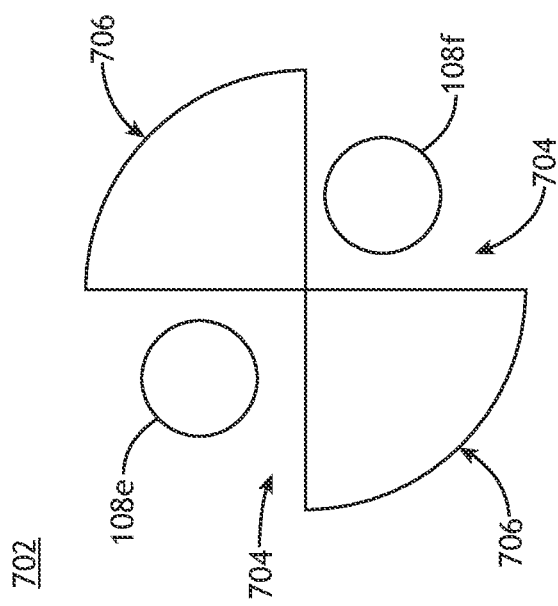
FIG. 7A
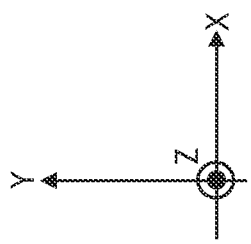

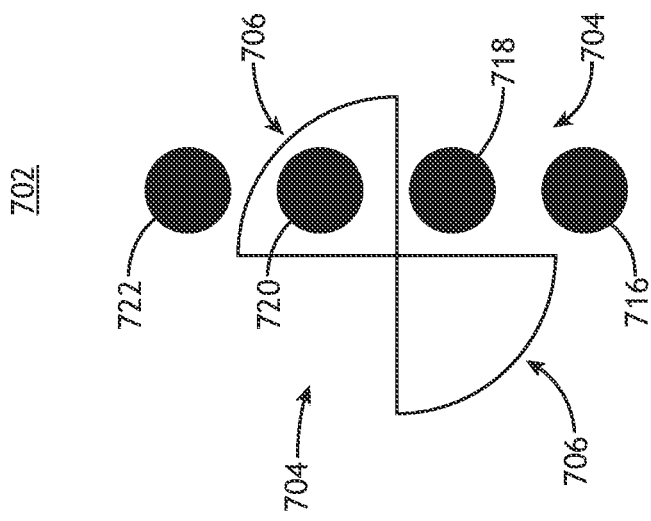
FIG. 7C
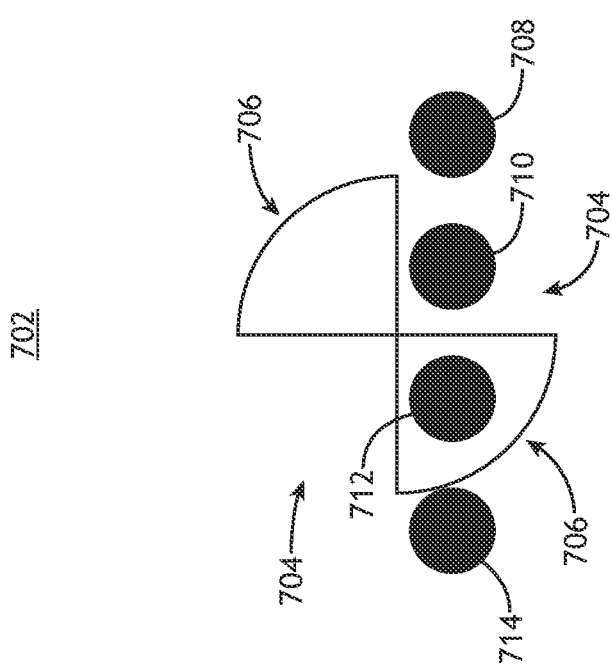
FIG. 7B
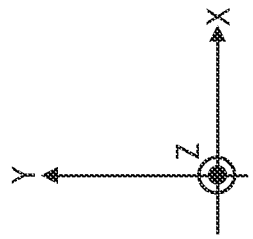

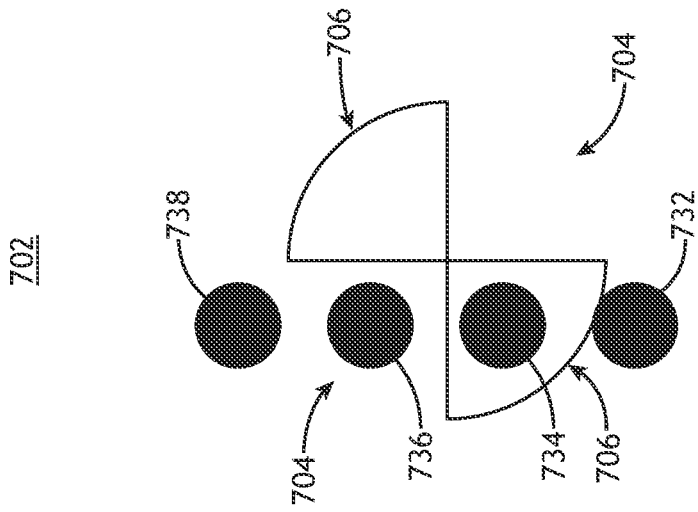
FIG. 7E
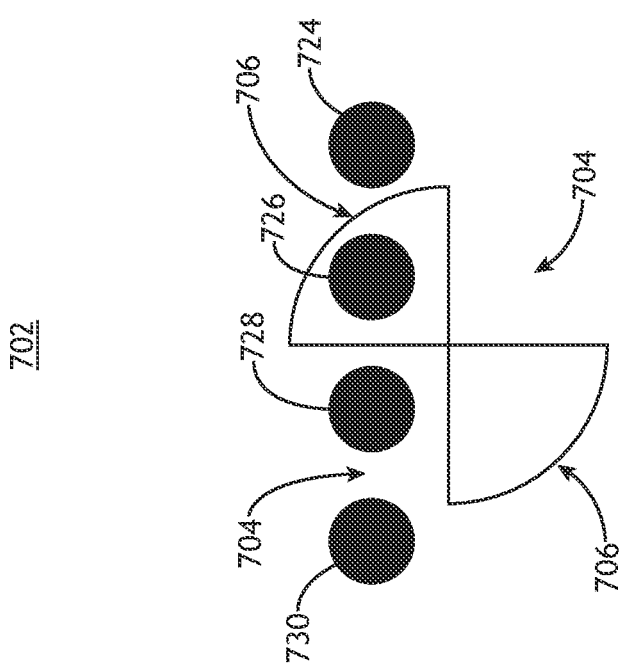
FIG. 7D
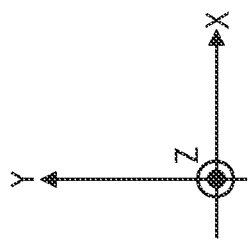

SCANNING SCATTEROMETRY OVERLAY MEASUREMENT

TECHNICAL FIELD

The present disclosure relates generally to scatterometry overlay metrology and, more particularly, to scanning overlay metrology on samples in motion.

BACKGROUND

Increasing demands for smaller semiconductor devices is resulting in corresponding increased demand for accurate and efficient metrology. One approach to increasing the efficiency and throughput of a metrology tool is to generate metrology data on a sample as it is in motion rather than in a static location in a measurement field of view. In this way, time delays associated with settling of the translation stage prior to a measurement may be eliminated. Metrology systems typically generate metrology data associated with a sample by measuring or otherwise inspecting dedicated metrology targets distributed across the sample. Accordingly, the sample is typically mounted on a translation stage and translated such that the metrology targets are sequentially moved into a measurement field of view. In typical metrology systems employing a move and measure (MAM) approach, the sample is static during each measurement. However, the time required for the translation stage to settle prior to a measurement may negatively impact the throughput. Therefore, it is desirable to provide systems and methods for curing the above deficiencies.

SUMMARY

An overlay metrology system is disclosed in accordance with one or more illustrative embodiments of the present disclosure. In one illustrative embodiment, the system includes an illumination sub-system to sequentially illuminate an overlay target on a sample with a first illumination lobe and a second illumination lobe opposite the first illumination lobe, where the overlay target includes one or more grating-over-grating features formed from periodic structures on a first sample layer and a second sample layer, and where the one or more grating-over-grating structures are periodic along a measurement direction. In another illustrative embodiment, the system includes an imaging sub-system with an objective lens and a detector to generate a first image and a second image of the overlay target, where the first image includes an unresolved image of the one or more grating-over-grating structures formed from a single non-zero diffraction order of the first illumination lobe generated by the one or more grating-over-grating structures along the measurement direction, and where the second image includes an unresolved image of the one or more grating-over-grating structures formed from a single non-zero diffraction order of the second illumination lobe generated by the one or more grating-over-grating structures along the measurement direction. In another illustrative embodiment, the system includes a controller communicatively coupled to the detector to determine an overlay error between the first layer and the second layer of the sample along the measurement direction based on the first image and the second image.

An overlay metrology system is disclosed in accordance with one or more illustrative embodiments of the present disclosure. In one illustrative embodiment, the system includes an illumination sub-system to provide a first pair of opposing illumination lobes along a first measurement direction and a second pair of illumination lobes along a second measurement direction orthogonal to the first measurement direction. In another illustrative embodiment, the illumination sub-system sequentially illuminates an overlay target on a sample with first and second illumination configurations, where the first illumination configuration includes one illumination lobe from each of the first and second pairs of opposing illumination lobes and the second illumination configuration includes a remaining illumination lobe from each of the first and second pairs of illumination lobes. In another illustrative embodiment, the overlay target includes a first set of one or more cells including one or more grating-over-grating features formed from periodic structures on a first sample layer and a second sample layer, where the one or more grating-over-grating structures are periodic along the first direction. In another illustrative embodiment, the overlay target further includes a second set of one or more cells including one or more grating-over-grating features formed from periodic structures on the first sample layer and the second sample layer, where the one or more grating-over-grating structures are periodic along the second measurement direction. In another illustrative embodiment, the system includes an imaging sub-system with an objective lens and a detector to generate a first image and a second image of the overlay target, where the first image is formed with a single non-zero diffraction order from each illumination lobe in the first illumination configuration, and where the second image is formed with a single non-zero diffraction order from each illumination lobe in the second illumination configuration. In another illustrative embodiment, the system includes a controller communicatively coupled to the detector to determine an overlay error between the first layer and the second layer of the sample along the first and second measurement directions based on the first and second images.

An overlay metrology method is disclosed in accordance with one or more illustrative embodiments of the present disclosure. In one illustrative embodiment, the method includes sequentially illuminating an overlay target on a sample with a first illumination lobe and a second illumination lobe, where the overlay target includes one or more grating-over-grating features formed from periodic structures on a first sample layer and a second sample layer, and where the one or more grating-over-grating structures are periodic along a measurement direction. In another illustrative embodiment, the method includes generating a first image and a second image of the overlay target with a detector, where the first image includes an unresolved image of the one or more grating-over-grating structures formed from a single non-zero diffraction order of the first illumination lobe from the one or more grating-over-grating structures along the measurement direction, and where the second image includes an unresolved image of the one or more grating-over-grating structures formed from a single non-zero diffraction order of the second illumination lobe generated by the one or more grating-over-grating structures along the measurement direction. In another illustrative embodiment, the method includes determining an overlay error between the first layer and the second layer of the sample along the measurement direction based on the first image and the second image.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 5B is a conceptual view of an image of the overlay target based on illumination with the third illumination beam or the fourth illumination beam in accordance with one or more embodiments of the present disclosure.

FIG. 7A is a conceptual view of a split pupil plane, in accordance with one or more embodiments of the present disclosure.

FIG. 7B is a conceptual view of the pupil plane illustrating the distribution of diffraction orders of a first illumination beam by a cell having periodicities in the Y direction in accordance with one or more embodiments of the present disclosure.

FIG. 7C is a conceptual view of the pupil plane illustrating the distribution of diffraction orders of the first illumination beam by a cell having periodicities in the X direction in accordance with one or more embodiments of the present disclosure.

FIG. 7D is a conceptual view of the pupil plane illustrating the distribution of diffraction orders of a second illumination beam by a cell having periodicities in the Y direction in accordance with one or more embodiments of the present disclosure.

FIG. 7E is a conceptual view of the pupil plane illustrating the distribution of diffraction orders of the second illumination beam by a cell having periodicities in the X direction in accordance with one or more embodiments of the present disclosure.

DETAILED DESCRIPTION

Figure 1A:
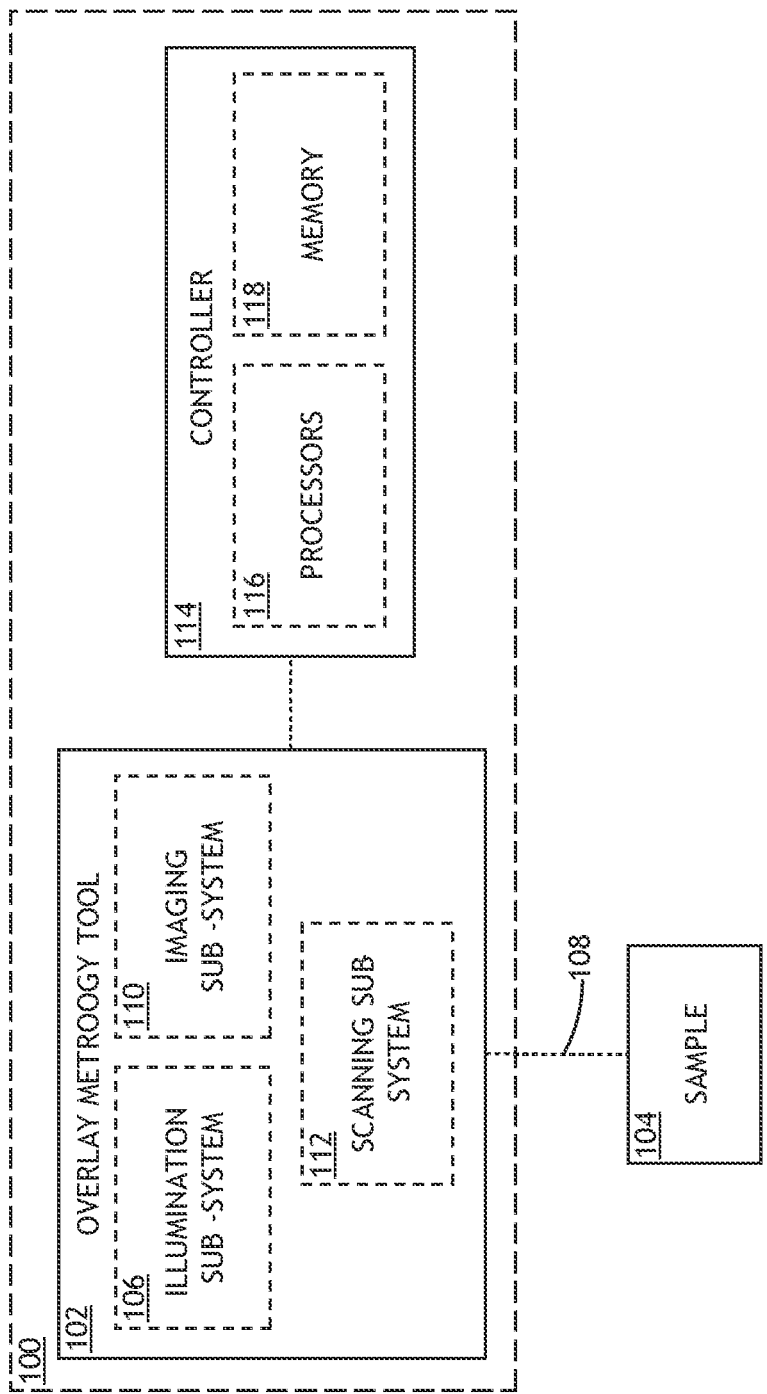
FIG. 1A is a conceptual view of a system for performing overlay metrology, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for scanning scatterometry metrology using field-plane imaging of grating-over-grating overlay targets based on sequential imaging of the targets with symmetrically opposed illumination beams while the overlay targets are in motion, where the field-plane images are formed using a single diffraction order along a measurement direction. In this regard, the field-plane images correspond to dark-field images where features of the overlay target are unresolved and differences in intensity of the overlay target features in the sequential images are proportional to overlay.

For the purposes of the present disclosure, the term scatterometry metrology is used to broadly encompass the terms scatterometry-based metrology and diffraction-based metrology. Further, the term scanning metrology is used to describe metrology measurements generated when samples are in motion. In a general sense, scanning metrology may be implemented by scanning a sample along a measurement path (e.g., a swath, or the like) such that regions of interest on the sample (e.g., metrology targets, device areas, or the like) are translated through a measurement field of view of a metrology system. Further, the process may be repeated for any number of measurement paths or repeated measurements of particular measurement paths to provide any selected number of measurements of the sample. Scatterometry metrology based on dark-field imaging of periodic overlay targets are described generally in U.S. patent application Ser. No. 16/996,328 filed on Aug. 18, 2020, which is incorporated by reference herein in its entirety.

Overlay targets may typically include well-defined printed elements designed to provide an accurate representation of the relative placements of features associated with one or more lithography steps on one or more sample layers. In this regard, measured characteristics of printed elements of an overlay target (e.g., by an overlay metrology tool) may be representative of printed device elements associated with a device being fabricated. Further, overlay targets may include one or more measurement cells, where each cell includes printed elements in one or more layers on the sample. An overlay measurement may then be based on any combination of measurements of the various cells of the overlay target.

In some embodiments, an overlay target suitable for scanning scatterometry metrology as disclosed herein may include one or more cells having a grating-over-grating structure, where a grating-over-grating structure includes periodic features (e.g., grating features) on overlapping regions of two or more layers of interest. In this way, the various grating features on the layers of interest may contribute to the diffraction of incident illumination and an overlay measurement may be generated based on analysis of the diffracted light.

In some embodiments, a scanning scatterometry overlay tool generates an overlay measurement along a measurement direction by sequentially generating two field-plane images of a scatterometry overlay target with opposing illumination beams (e.g., beams having opposite azimuth angles of incidence along the measurement direction), where each of the field-plane images is formed using a single non-zero diffraction order from the scatterometry overlay target. In this way, the grating-over-grating structures are unresolved in the field-plane images and appear as grey-scale features, where differences in intensity of the grey-scale features between the field-plane images is proportional to overlay.

It is contemplated herein that a distribution of diffracted orders associated with diffraction of an incident illumination beam may depend on a variety of illumination and collection conditions including, but not limited to, an angle of incidence of the illumination beam in both azimuth and altitude directions, a wavelength of the illumination beam, a pitch of periodic features on the sample, or a numerical aperture (NA) of collection optics. Further, an overlay metrology tool may include one or more elements to block one or more collected diffraction orders such that an image is based on selected diffraction orders. In this regard, the illumination beams may be directed to the overlay target at incidence angles outside the NA of the collection optics (e.g., in an outside-the-lens (OTL) configuration) through a common lens with the collection optics (e.g., in a through-the-lens (TTL) configuration).

Additional embodiments of the present disclosure are directed to overlay measurements in two directions (e.g., two orthogonal directions). For example, an overlay target may include a first set of one or more cells having periodicity along a first measurement direction and a second set of one or more cells having periodicity along a second measurement direction different than the first direction (e.g., orthogonal to the first direction). In this configuration, illumination of the overlay target with an illumination beam along the first direction (e.g., having an azimuth angle along the first direction) may provide for the collection of a single diffraction order along the first direction by the first set of cells and the collection of no diffraction orders along the second set of cells. As a result, only the first set of cells may be visible in the image. Similarly, only the second set of cells may be visible in an image generated with an illumination beam along the second direction. In some embodiments, overlay measurements along two directions are generated based on four images based on sequential quadrupole illumination, where two illumination beams are oriented at opposing azimuth angles along the first direction and two illumination beams are oriented at opposing azimuth angles along the second direction. In some embodiments, overlay measurements are based on two images based on sequential illumination with two pairs of illumination beams from a quadrupole distribution, where the first pair of illumination beams includes one illumination beam along the first direction and one illumination beam along the second direction, and the second pair of illumination beams includes the opposing beams along the first and second directions. In this way, all of the cells in the overlay target are visible in each image, but images of any particular cell are formed from a single diffraction order from a single illumination beam.

It is further contemplated herein that scanning metrology based on sequential illumination with opposing illumination beams may be implemented in a variety of ways. In some embodiments, images of an overlay target with opposing illumination beams are sequentially generated in sequential scans of the overlay target. In some embodiments, the images are generated during a single scan based on alternating the illumination and/or collection conditions during the scan. For example, an interleaved image may be generated based on alternately illuminating the overlay target with the opposing illumination beams, where the two field-plane images may be extracted from the interleaved image. In one instance, a scanning scatterometry measurement tool is configured to illuminate alternating rows on a TDI sensor and synchronize the alternating illumination conditions of the scatterometry overlay target with a charge transfer rate of the TDI sensor to generate the interleaved image. The generation of interleaved images in scanning metrology using a TDI sensor is described generally in U.S. patent application Ser. No. 16/586,504 filed on Sep. 27, 2019, which is incorporated by reference in its entirety.

Additionally, it is to be understood that although many examples in the present disclosure relate to scanning metrology, the systems and methods disclosed herein are not limited to scanning metrology. Rather, it is contemplated herein that the systems and methods disclosed herein may also be utilized in a static measurement mode in which the sample is static during a measurement.

Referring now to FIGS. 1A-9, systems and methods for scatterometry overlay metrology are described in greater detail in accordance with one or more embodiments of the present disclosure.

FIG. 1A is a conceptual view of a system 100 for performing overlay metrology, in accordance with one or more embodiments of the present disclosure.

In one embodiment, the system 100 includes an overlay metrology tool 102 to generate one or more field-plane images of a sample 104, or a portion thereof, based on a single non-zero diffracted order from the sample 104 along any given measurement direction. For example, the system 100 may generate dark-field images of an overlay target including features in two or more layers of the sample 104.

In one embodiment, the overlay metrology tool 102 includes an illumination sub-system 106 to generate illumination in the form of at least one illumination beam 108 at a time to illuminate the sample 104 and an imaging sub-system 110 to image the illuminated sample 104. In another embodiment, the overlay metrology tool 102 includes a scanning sub-system 112 to position the sample 104 in a measurement field of view for imaging. For example, the scanning sub-system 112 may include one or more translation stages securing the sample 104 configured to position overlay targets within the measurement field of view to be imaged. Further, the overlay metrology tool 102 may illuminate and image the sample 104 in scanning and/or static modes. For example, the overlay metrology tool 102 may implement scanning overlay measurements by coordinating the illumination by the illumination sub-system 106 and image capture by the imaging sub-system 110 with the motion of the sample 104 along a measurement path (e.g., a swath) by the scanning sub-system 112 to capture images of overlay targets on the measurement path. By way of another example, the overlay metrology tool 102 may implement static overlay measurements by sequentially translating the sample 104 to position overlay targets in a measurement field of view and imaging the overlay targets while the sample 104 is stationary.

The overlay metrology tool 102 may be suitable for generating field-plane images of a variety of overlay target designs on a variety of sample configurations. In one embodiment, the sample 104 is formed as two or more patterned layers on a single wafer. An overlay target including target features on two or more sample layers of the single wafer may thus provide overlay measurements between the two or more sample layers of the single wafer. In another embodiment, the sample 104 is formed as two wafers bonded together at an interface, where each wafer may include one or more patterned layers near the interface (e.g., the inward facing sides of the wafers). An overlay target including target features on at least one sample layer of each wafer may thus provide an overlay measurement of the alignment of the two wafers during the bonding process.

The overlay metrology tool 102 may be configurable to generate images based on any number of recipes defining measurement parameters for the determining overlay of an overlay target. For example, a recipe of an overlay metrology tool 102 may include, but is not limited to, an illumination wavelength, a detected wavelength of radiation emanating from the sample, a spot size of illumination on the sample, an angle of incident illumination in azimuth or altitude directions, a polarization of incident illumination, a position of a beam of incident illumination on an overlay target, a position of an overlay target in the focal volume of the overlay metrology tool, or the like.

In one embodiment, an overlay measurement along a particular measurement direction is generated by generating two images of the sample 104, or a portion thereof such as an overlay target, based on sequential illumination with two opposing illumination beams (e.g., beams having opposite azimuth angles), where periodic features along a given direction on the sample 104 are imaged based on a single diffraction order from a single illumination beam at a time. In this regard, the periodic features are unresolved, but differences in intensity of the unresolved images of the periodic features between two images generated with the opposing illumination beams are proportional to overlay along the direction of periodicity of the features.

In another embodiment, the system 100 includes a controller 114 including one or more processors 116 communicatively coupled to the overlay metrology tool 102. For example, the one or more processors 116 may be configured to execute a set of program instructions maintained in a memory device 118, or memory. The one or more processors 116 of a controller 114 may include any processing element known in the art. In this sense, the one or more processors 116 may include any microprocessor-type device configured to execute algorithms and/or instructions. Further, the memory device 118 may include any storage medium known in the art suitable for storing program instructions executable by the associated one or more processors 116. For example, the memory device 118 may include a non-transitory memory medium. As an additional example, the memory device 118 may include, but is not limited to, a read-only memory, a random-access memory, a magnetic or optical memory device (e.g., disk), a magnetic tape, a solid-state drive and the like. It is further noted that memory device 118 may be housed in a common controller housing with the one or more processors 116.

In this regard, the controller 114 may execute any of various processing steps associated with overlay metrology. For example, the controller 114 may be configured to generate control signals to direct or otherwise control the overlay metrology tool 102, or any components thereof. For instance, the controller 114 may be configured to direct the overlay metrology tool 102 or any components thereof to generate one or more images based on one or more selected recipes defining measurement parameters for the determining overlay of an overlay target based on dark-field imaging. A recipe of an overlay metrology tool may include, but is not limited to, an illumination wavelength, a detected wavelength of radiation emanating from the sample, a spot size of illumination on the sample, an angle of incident illumination, a polarization of incident illumination, a position of a beam of incident illumination on an overlay target, a position of an overlay target in the focal volume of the overlay metrology tool, or the like.

By way of another example, the controller 114 may be further configured to receive data including, but not limited to, images from the overlay metrology tool 102. By way of another example, the controller 114 may be configured to determine overlay associated with an overlay target based on the acquired images. By way of another example, the controller 114 may generate correctables for one or more additional fabrication tools as feedback and/or feed-forward control of the one or more additional fabrication tools based on overlay measurements from the overlay metrology tool 102.

Figure 1B:
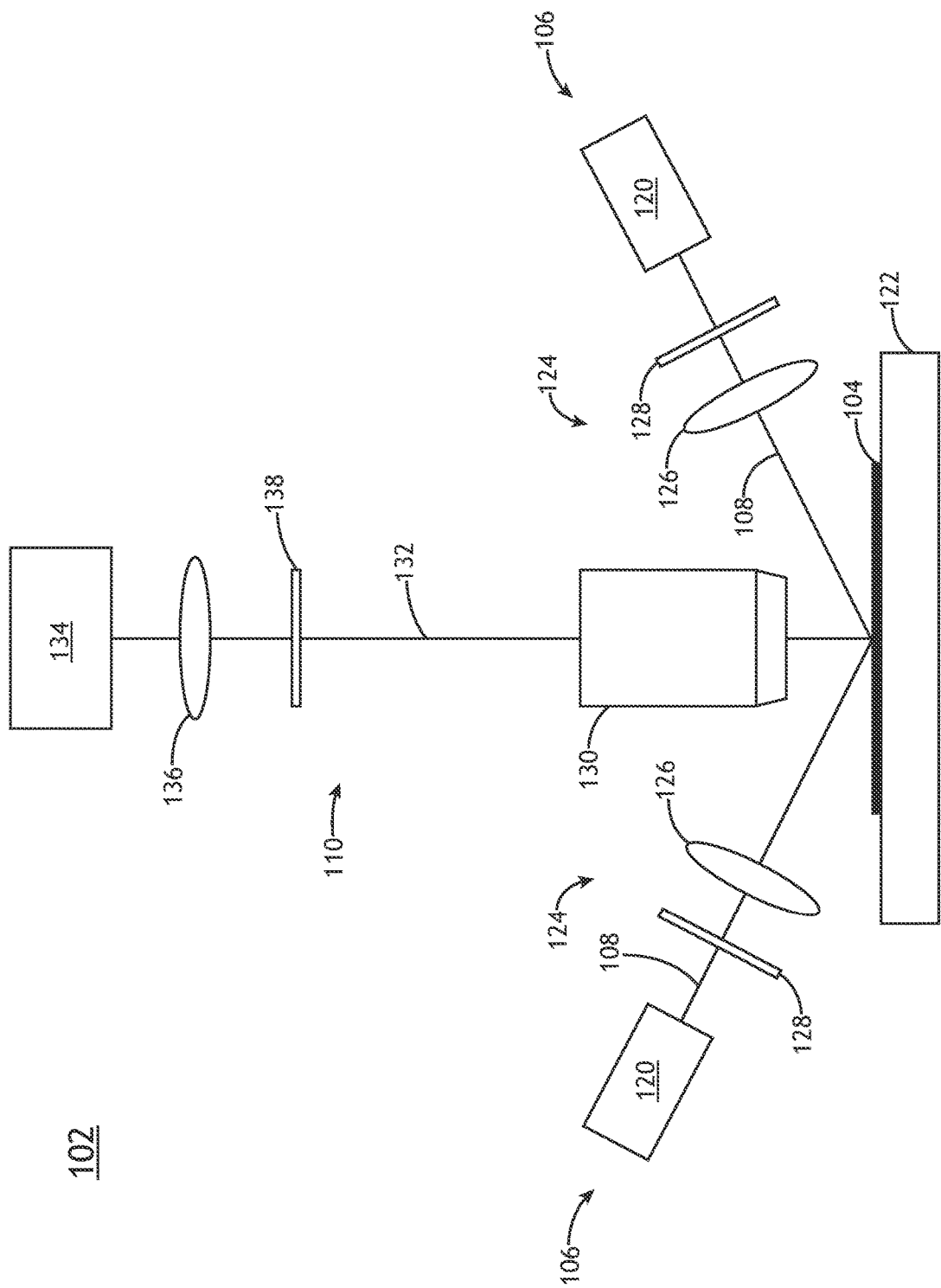
FIG. 1B is a conceptual view of the overlay metrology tool illustrating OTL (outside-the-lens) illumination, in accordance with one or more embodiments of the present disclosure.
Figure 1C:
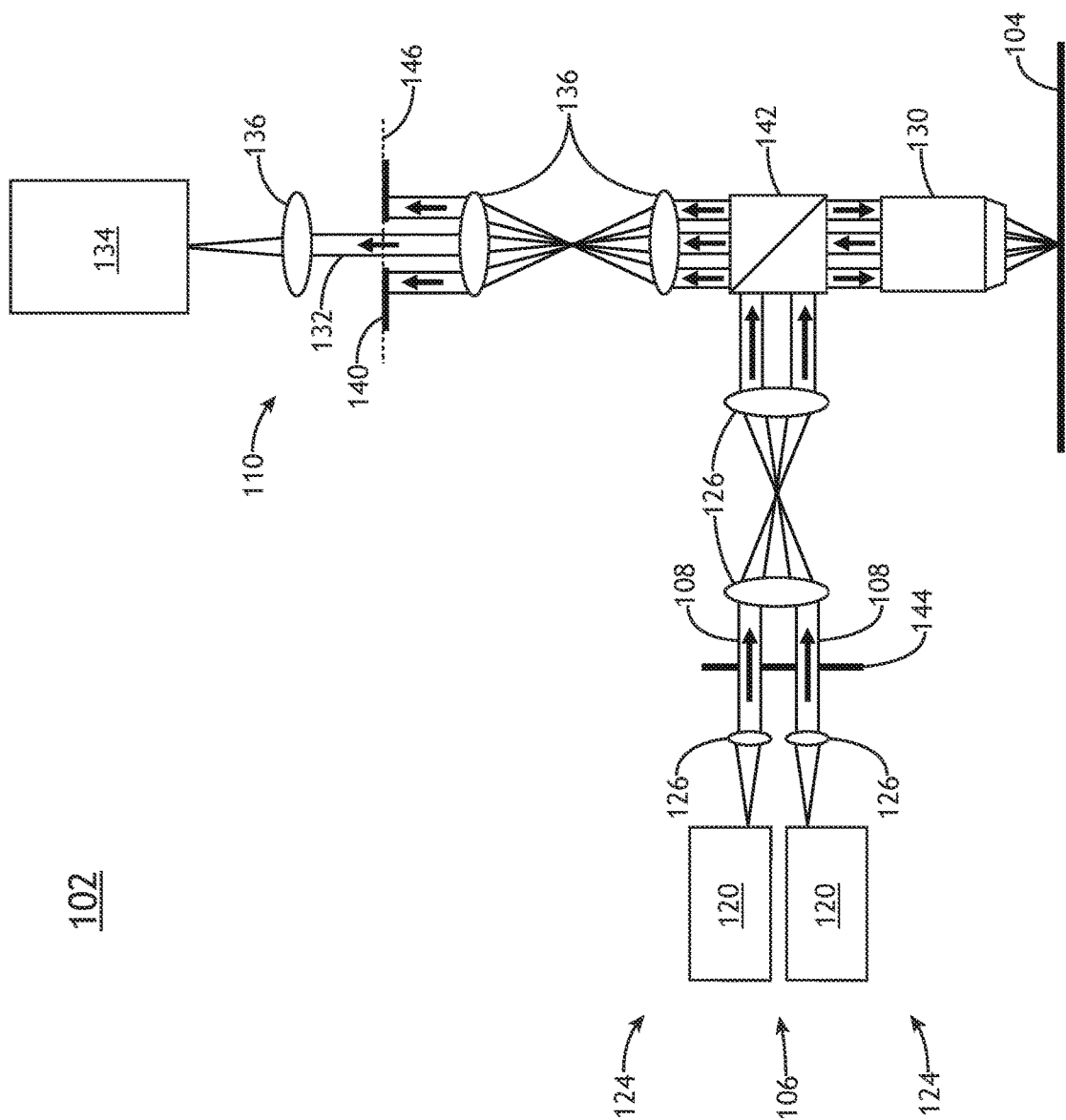
FIG. 1C is a conceptual view of the overlay metrology tool illustrating oblique TTL (through-the-lens) dark-field imaging with a dark-field stop, in accordance with one or more embodiments of the present disclosure.
Figure 1D:
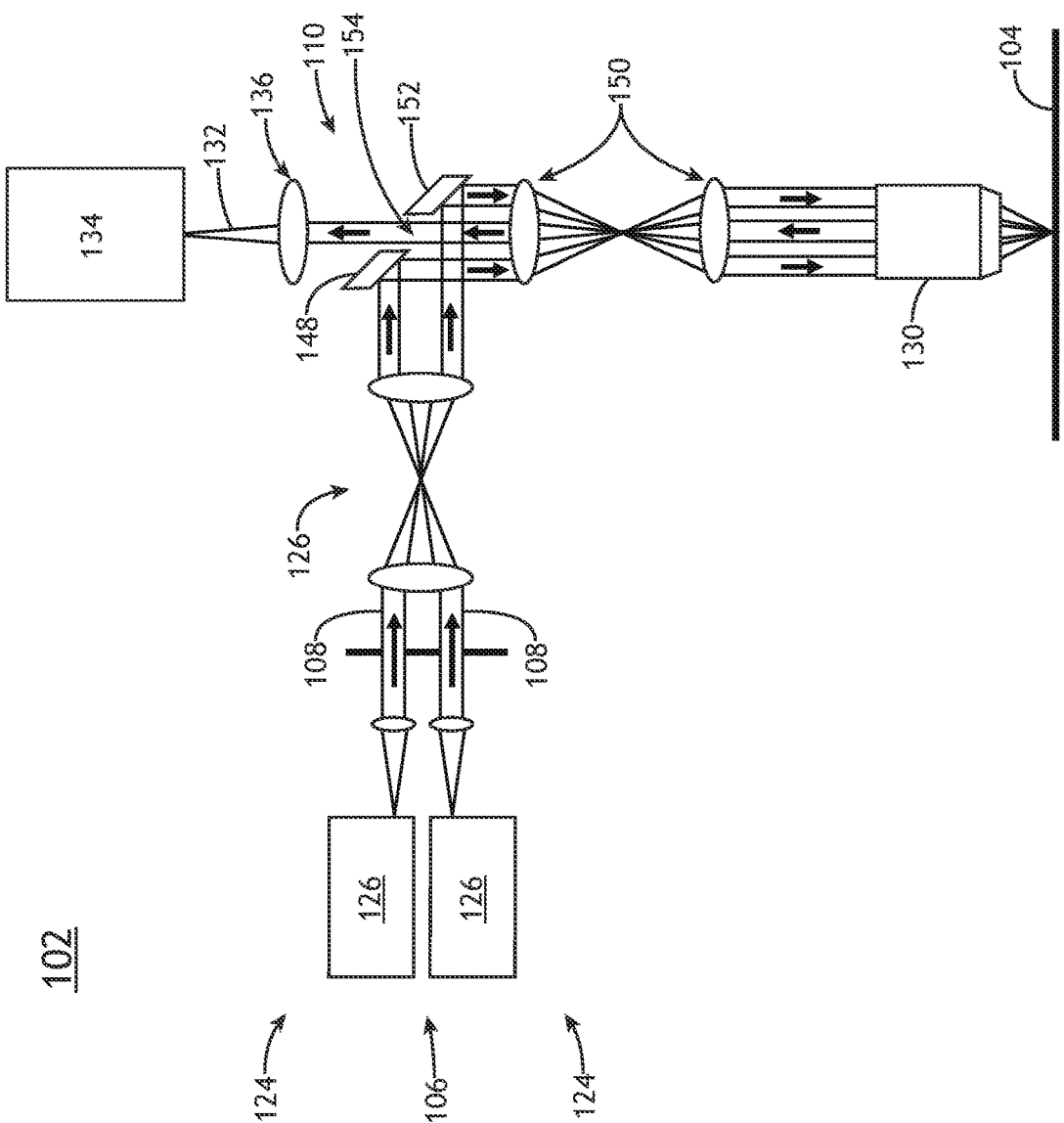
FIG. 1D is a conceptual view of the overlay metrology tool illustrating oblique TTL dark-field imaging with a dark-field mirror, in accordance with one or more embodiments of the present disclosure.

Referring now to FIGS. 1B-1D, various non-limiting configurations of the overlay metrology tool 102 are described in accordance with one or more embodiments of the present disclosure. It is contemplated herein that the overlay metrology tool 102 may generate dark-field images of the sample 104 (e.g., images of an overlay target on the sample 104) based on a single diffraction order using a variety of configurations including, but not limited to OTL and TTL illumination.

FIG. 1B is a conceptual view of the overlay metrology tool 102 illustrating OTL illumination, in accordance with one or more embodiments of the present disclosure. It is contemplated herein that OTL illumination for darkfield imaging as disclosed herein may beneficially provide for relatively small target sizes, high light efficiency associated with direct illumination of the sample 104, and low stray light from physically separating illumination and collection paths without the need for blockers or masks. For example, OTL illumination may provide small target sizes by illuminating the sample with relatively higher incidence angles (e.g., altitude angles) than TTL illumination, which may in turn require periodic features on the sample 104 to diffract a single diffraction order into the collection path of the imaging sub-system 110 based on the grating equation.

In one embodiment, the illumination sub-system 106 of the overlay metrology tool 102 includes at least one illumination source 120 configured to generate at least one illumination beam 108. An illumination beam 108 may include one or more selected wavelengths of light including, but not limited to, ultraviolet (UV) radiation, visible radiation, or infrared (IR) radiation. Further, the illumination beam 108 may be an incoherent illumination beam. In this regard, images of the sample 104 generated based on the illumination beam 108 may not be impacted by speckle.

The illumination source 120 may include any type of illumination source suitable for providing an illumination beam 108. In one embodiment, the illumination source 120 is a laser source combined with a speckle-busting element, which may include any type of speckle-busting element known in the art (e.g., a rotating diffuser, a beam scanner for scanning the illumination beam 108 on an input face of an optical fiber, a fiber-agitating mechanism, or the like). For example, the illumination source 120 may include, but is not limited to, one or more narrowband laser sources, a broadband laser source, a supercontinuum laser source, a white light laser source, or the like. In another embodiment, the illumination source 120 includes a laser-sustained plasma (LSP) source. For example, the illumination source 120 may include, but is not limited to, a LSP lamp, a LSP bulb, or a LSP chamber suitable for containing one or more elements that, when excited by a laser source into a plasma state, may emit broadband illumination. In another embodiment, the illumination source 120 includes a lamp source. For example, the illumination source 120 may include, but is not limited to, an arc lamp, a discharge lamp, an electrode-less lamp, or the like. In this regard, the illumination source 120 may provide an illumination beam 108 having low coherence (e.g., low spatial coherence and/or temporal coherence).

Further, the sample 104 may be disposed on a sample stage 122 (e.g., a part of the scanning sub-system 112) suitable for securing the sample 104 and further configured to position the sample 104 with respect to the illumination beam 108.

In another embodiment, the overlay metrology tool 102 directs the illumination beam 108 to the sample 104 through one or more illumination channels 124 to illuminate the sample 104 for an image. Each of the illumination channels 124 may include one or more optical components suitable for modifying and/or conditioning an illumination beam 108 as well as directing an illumination beam 108 to the sample 104. For example, each of the illumination channels 124 may include, but is not required to include, one or more illumination lenses 126 (e.g., to control a spot size of the illumination beam 108 on the sample 104, to relay pupil and/or field planes, or the like) or one or more illumination control optics 128. For example, the illumination control optics 128 may include, but are not limited to, one or more polarizers to adjust the polarization of the illumination beam 108, one or more filters, one or more beam splitters, one or more diffusers, one or more homogenizers, one or more apodizers, one or more beam shapers, or one or more mirrors (e.g., static mirrors, translatable mirrors, scanning mirrors, or the like).

Further, the illumination channels 124 may be provided in a variety of configurations to direct one or more illumination beams 108 to the sample 104. In one embodiment, as illustrated in FIG. 1B, each illumination channel 124 may include a separate set of components (e.g., illumination lenses 126 and/or illumination control optics 128). By way of another example, illumination sub-system 106 may include a common set of illumination lenses 126 and/or illumination control optics 128 for generating one or more illumination beams 108 and directing the illumination beams 108 to the sample 104. Further, the illumination sub-system 106 may direct the one or more illumination beams 108 to the sample 104 using any combination of free space or fiber optics.

In another embodiment, the imaging sub-system 110 of the overlay metrology tool 102 includes an objective lens 130 to collect diffracted or scattered light from the sample 104 (e.g., sample light 132) and at least one detector 134 located at a field plane conjugate to the sample 104 configured to generate an image of the sample 104 based on at least some of the sample light 132. The imaging sub-system 110 may further include multiple optical elements to direct and/or modify illumination collected by the objective lens 130 including, but not limited to one or more imaging lenses 136 or imaging control optics 138. For example, the imaging control optics 138 may include, but are not limited to, one or more filters, one or more polarizers, one or more beam blocks, or one or more beamsplitters.

FIG. 1C is a conceptual view of the overlay metrology tool 102 illustrating oblique TTL dark-field imaging with a dark-field stop 140, in accordance with one or more embodiments of the present disclosure. In one embodiment, the overlay metrology tool 102 includes a beamsplitter 142 configured to merge the illumination sub-system 106 and the imaging sub-system 110 such that the objective lens 130 may simultaneously direct one or more illumination beams 108 to the sample 104 and collect sample light 132 from the sample 104. For example, FIG. 1C illustrates multiple illumination channels 124 providing illumination beams 108 to a common illumination field stop 144 of the illumination sub-system 106. In another embodiment, the dark-field stop 140 is located at a pupil plane 146 unique to the imaging sub-system 110 and includes one or more opaque elements to block specular reflection (e.g., 0-order diffraction) collected by the objective lens 130 and pass a single non-zero diffraction order for dark-field imaging.

FIG. 1D is a conceptual view of the overlay metrology tool 102 illustrating oblique TTL dark-field imaging with a dark-field mirror 148, in accordance with one or more embodiments of the present disclosure. As in FIG. 1C, FIG. 1C illustrates multiple illumination channels 124 providing illumination beams 108 to a common illumination field stop 144 of the illumination sub-system 106. Further, as illustrated in FIG. 1D, the overlay metrology tool 102 may include, but is not required to include, an optical relay 150 between the dark-field mirror 148 and the objective lens 130.

In one embodiment, the dark-field mirror 148 includes one or more reflective regions 152 to direct one or more illumination beams 108 to the objective lens 130 for illuminating the sample 104 and an open central region 154. For example, the dark-field mirror 148 may include, but is not limited to, an annular mirror with an open central aperture. In this way, the dark-field mirror 148 may simultaneously direct one or more illumination beams 108 along a range of oblique solid angles, block sample light 132 associated with specular reflection (e.g., 0-order diffraction) collected by the objective lens 130, and pass a single non-zero diffraction order for dark-field imaging. The dark-field mirror 148 may be, but is not required to be, located at or near a pupil plane common to the illumination channels 124 and the imaging sub-system 110. In this regard, the spatial dimensions of the dark-field mirror 148 in the pupil plane may directly correspond to the range of solid angles at which the illumination beam 108 is directed to the sample 104 and the open apertures may correspond to a range of solid angles of collected sample light 132 allowed to propagate to the detector 134 to form the dark-field image. In the case that the dark-field mirror 148 is located near the pupil plane or the dark-field mirror 148 is tilted with respect to the pupil plane, at least a portion of the pupil plane may be defocused on the dark-field mirror 148, resulting in pupil blur at the dark-field mirror 148. However, the impact of this pupil blur may be mitigated by providing sufficient separation between the illumination beams 108 and the desired non-zero diffraction order to be passed to the detector 134.

It is to be understood that FIGS. 1B-1D and the associated descriptions are provided solely for illustrative purposes and should not be interpreted as limiting. Rather, it is contemplated herein that the overlay metrology tool 102 may be configured in various ways to provide imaging with a single non-zero diffraction order. For example, FIGS. 1B-1D illustrate a separate illumination source 120 for each illumination channel 124. However, any number of illumination beams 108 may be generated by any number or combination of illumination sources 120. By way of another example, the overlay metrology tool 102 may include any combination of free-space optics and fiber optics to provide a suitable physical layout.

Referring now to FIGS. 2A-7E, the generation of field-plane images of grating-over-grating overlay metrology targets formed from a single non-zero diffraction order along a given measurement direction is described in greater detail in accordance with one or more embodiments of the present disclosure.

Figure 2A:
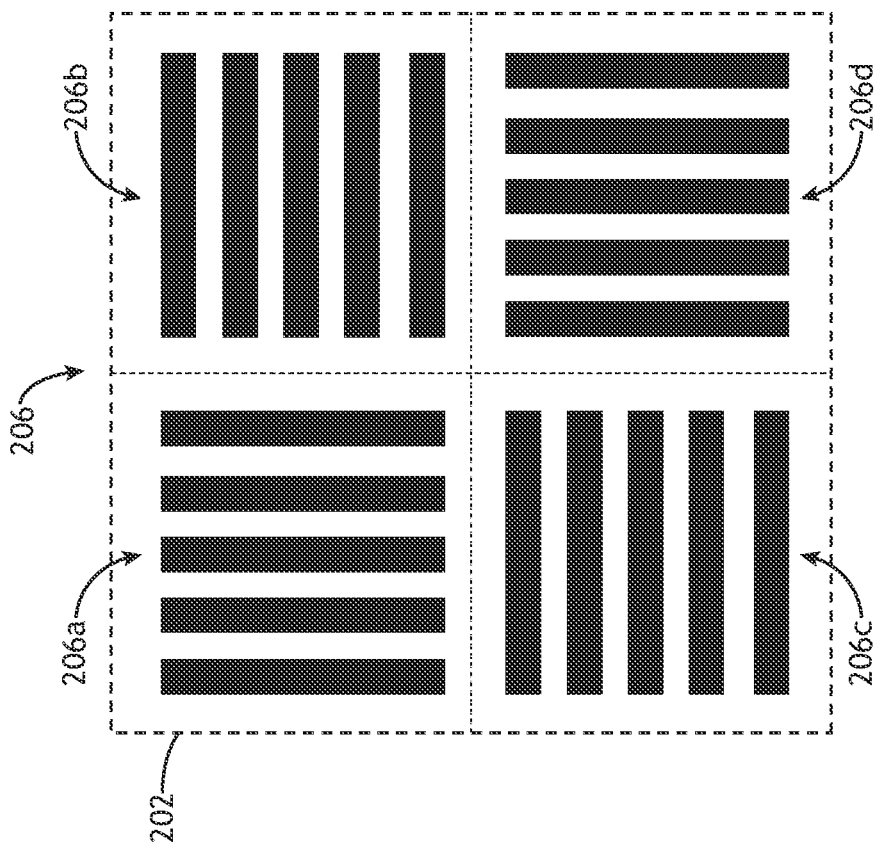
FIG. 2A is a top view of an overlay target with overlapping grating-over-grating features, in accordance with one or more embodiments of the present disclosure.
Figure 2A:
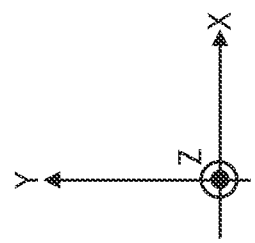
Figure 2B:
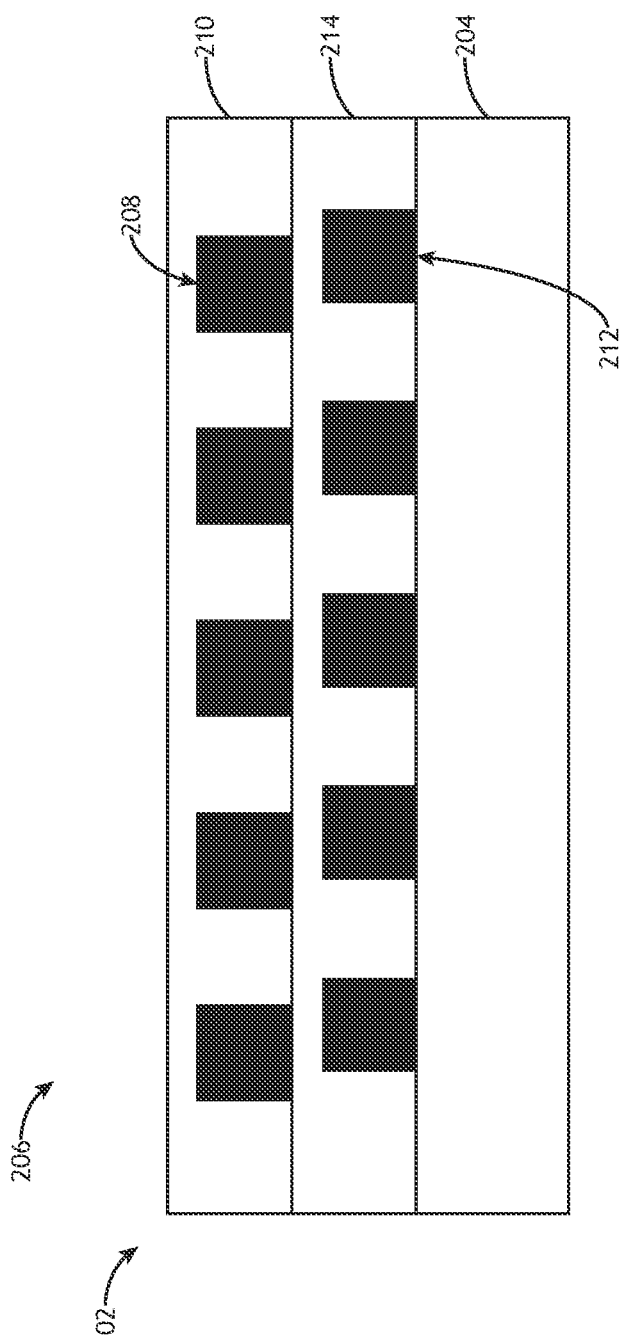
FIG. 2B is a side view of a single cell of the overlay target, in accordance with one or more embodiments of the present disclosure.

FIG. 2A is a top view of an overlay target 202 with overlapping grating-over-grating features, in accordance with one or more embodiments of the present disclosure. FIG. 2B is a side view of a single cell 206 of the overlay target 202 on a substrate 204, in accordance with one or more embodiments of the present disclosure. In one embodiment, the overlay target 202 includes multiple cells 206, where each cell 206 includes first-layer printed elements 208 located on a first layer 210 of the sample 104 and second-layer printed elements 212 located on a second layer 214 of the sample 104 oriented such that the regions including the first-layer printed elements 208 and the second-layer printed elements 212 overlap to form a grating-over-grating structure. In this regard, the grating-over-grating features in each cell 206 may diffract an incident illumination beam 108 into discrete diffraction orders.

In another embodiment, the overlay target 202 includes a first set of one or more cells 206 in which the grating-over-grating structures are periodic along a first direction and a second set of one or more cells 206 in which the grating-over-grating structures are periodic along a second direction different than the first direction (e.g., orthogonal).

For example, FIGS. 2A-2B illustrate an overlay target 202 having four cells 206a-d, where cell 206a and cell 206d form a first set of cells and cell 206b and cell 206c form a second set of cells. In particular, the grating-over-grating structures in cell 206a and cell 206d are periodic in the X direction and the grating-over-grating structures in cell 206b and cell 206c are periodic in the Y direction. In this regard, cells 206a,d may be suitable for overlay measurements along the X direction and cells 206b,c may be suitable for overlay measurements along the Y direction as will be described in greater detail below.

It is to be understood, however, that the overlay target 202 in FIGS. 2A and 2B and the associated description are provided solely for illustrative purposes and should not be interpreted as limiting. Rather, the overlay target 202 may include any suitable grating-over-grating overlay target design. For example, the overlay target 202 may include any number of cells 206 suitable for measurements along two directions. Further, the cells 206 may be distributed in any pattern or arrangement. For example, metrology target designs suitable for scanning metrology are generally described in U.S. patent application Ser. No. 16/598,146 filed on Oct. 10, 2019, which is incorporated herein by reference in its entirety. In one embodiment, the overlay target 202 includes one or more cell groupings distributed along a scanning direction (e.g., a direction of motion of the sample 104), where cells 206 within each particular cell grouping are oriented to have grating-over-grating structures periodic along a common direction. For example, a first cell grouping may include one or more cells 206 having periodicities along the X direction and a second cell grouping may include one or more cells 206 having periodicities along the Y direction. In this way, all cells 206 within a particular cell grouping may be imaged at the same time while the sample 104 is scanned through a measurement field of view of the imaging sub-system 110.

Referring now to FIGS. 3-6, illumination and collection configurations for scatterometry overlay metrology measurements of an overlay target 202 based on a single non-zero diffraction order are described in greater detail herein.

Figure 3:
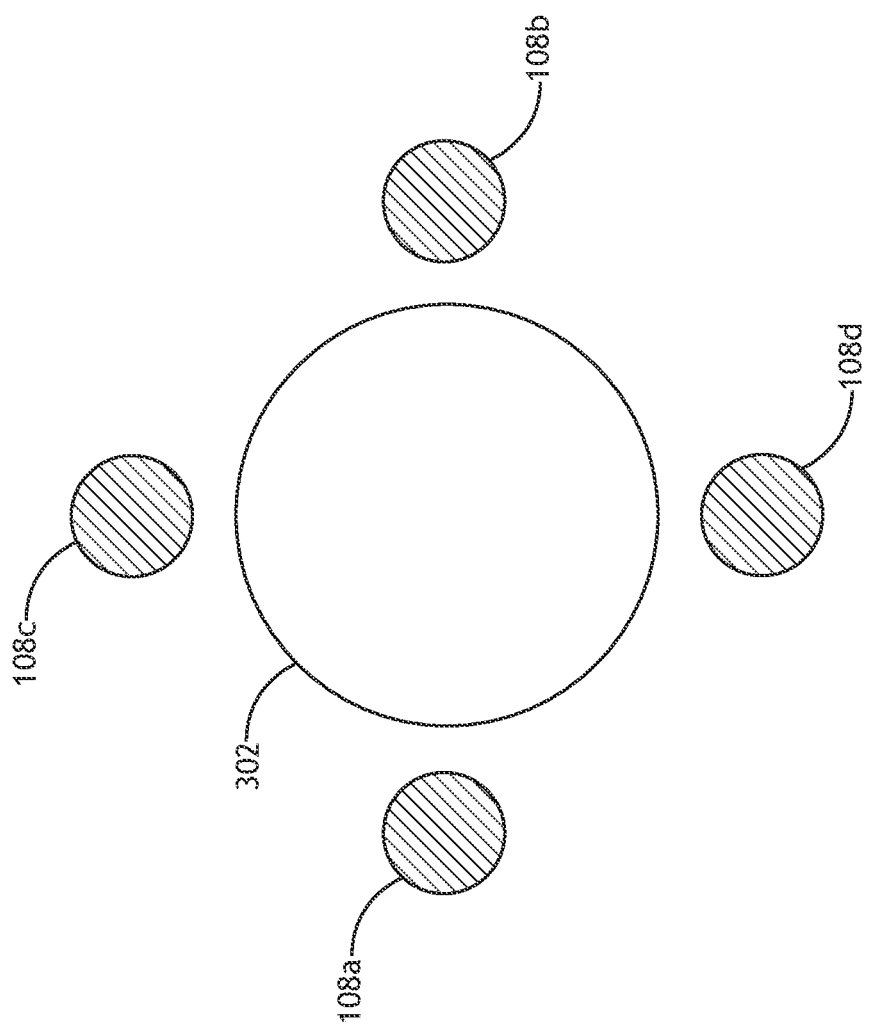
FIG. 3 is a schematic view of a pupil plane illustrating distribution of illumination beams providing quadrupole illumination suitable in accordance with one or more embodiments of the present disclosure.

FIG. 3 is a schematic view of a pupil plane illustrating distribution of illumination beams 108a-d providing quadrupole illumination suitable in accordance with one or more embodiments of the present disclosure. In one embodiment, the first illumination beam 108a and the second illumination beam 108b may be oriented to illuminate the sample 104 along the X direction at symmetrically-opposed azimuth angles. In another embodiment, the third illumination beam 108c and the fourth illumination beam 108d may be oriented to illuminate the sample 104 along the Y direction at symmetrically-opposed azimuth angles. Further, FIG. 3 illustrates boundaries of a collection pupil 302 of the imaging sub-system 110. For example, the boundaries of the collection pupil 302 in FIG. 3 may correspond to a NA of the objective lens 130 or a diameter of a pupil stop in the imaging sub-system 110.

In FIG. 3, the illumination beams 108a-d are illustrated as being located outside the collection pupil 302 to illustrate dark-field collection in which 0-order diffraction is not used for imaging. It is contemplated herein that this dark-field configuration in FIG. 3 may be generated in various ways. For example, the configuration in FIG. 3 may be generated using OTL illumination as illustrated in FIG. 1B. In this regard, one or more illumination channels 124 may deliver the illumination beams 108a-d directly to the sample 104 outside the NA of the objective lens 130. By way of another example, the configuration in FIG. 3 may be generated using TTL illumination as illustrated in FIGS. 1C and 1D, where the overlay metrology tool 102 selectively blocks 0-order diffraction of the illumination beams 108a-d (e.g., using a dark-field stop 140, a dark-field mirror 148, or the like). In a general sense, FIG. 3 may not necessarily correspond to a particular pupil plane in the system, but rather illustrates dark-field illumination in accordance with one or more embodiments of the present disclosure.

FIGS. 4A-4D illustrate imaging of the cell 206a of the overlay target 202 as an example of imaging features having a periodicity along the X direction, in accordance with one or more embodiments of the present disclosure.

Figure 4A:
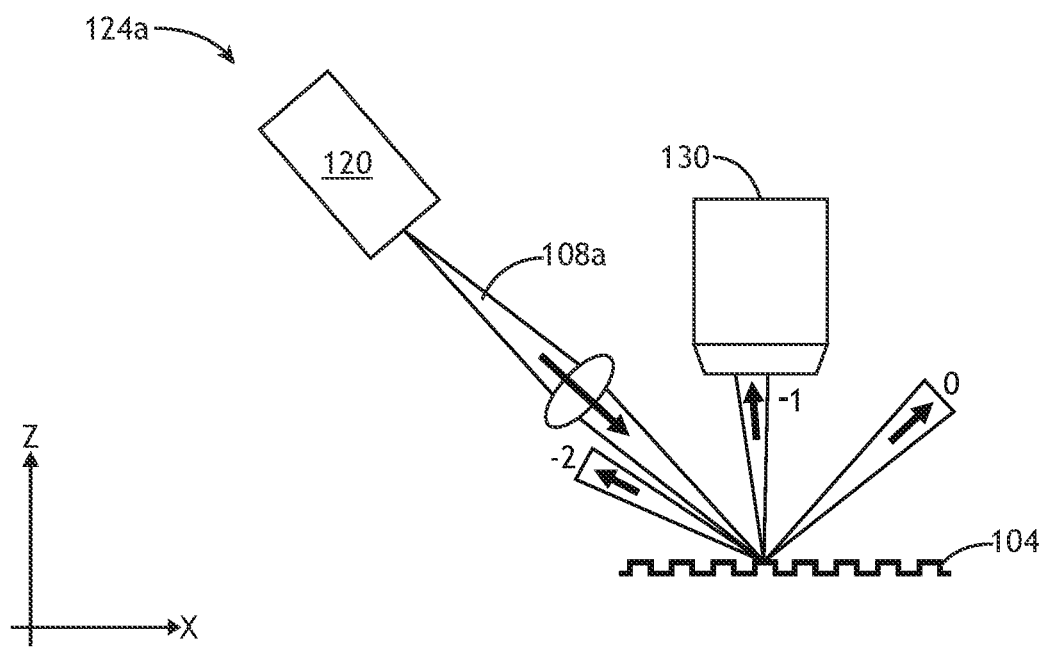
FIG. 4A is a schematic view of imaging a cell of the overlay target with the first illumination beam in FIG. 3 oriented along the X direction in accordance with one or more embodiments of the present disclosure.
Figure 4B:
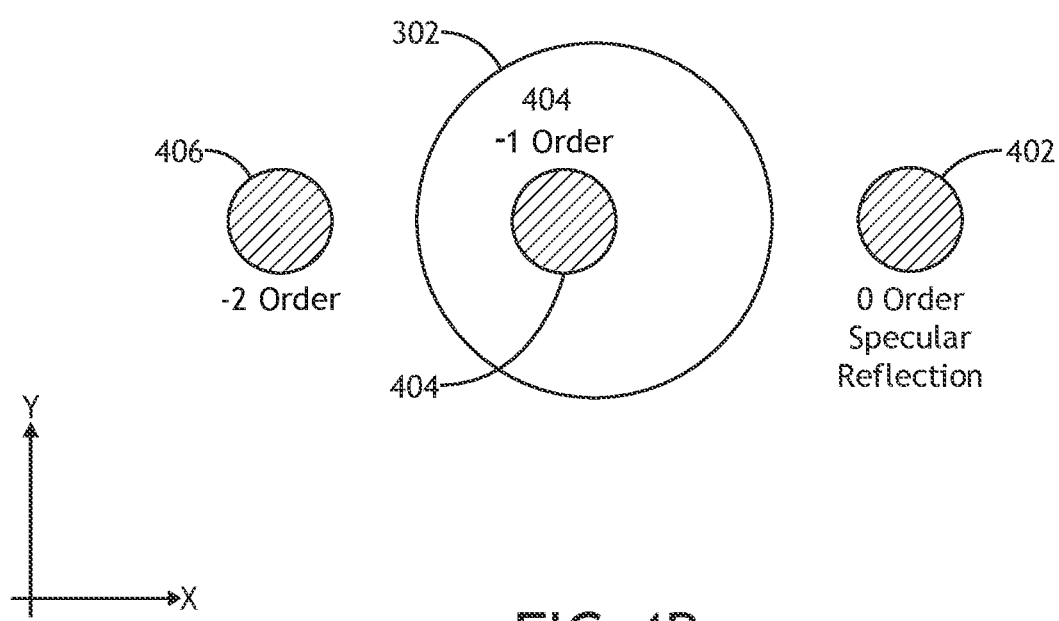
FIG. 4B is a schematic view of the collection pupil illustrating a distribution of diffraction orders of the first illumination beam generated by a cell in accordance with one or more embodiments of the present disclosure.

FIG. 4A is a schematic view of imaging the cell 206a of the overlay target 202 with the first illumination beam 108a in FIG. 3 oriented along the X direction in accordance with one or more embodiments of the present disclosure. FIG. 4B is a schematic view of the collection pupil 302 illustrating a distribution of diffraction orders of the first illumination beam 108a generated by the cell 206a in accordance with one or more embodiments of the present disclosure.

The grating-over-grating features of the cell 206a having periodicity along the X direction may diffract the first illumination beam 108a into multiple diffraction orders distributed along the X direction. In particular, FIGS. 4A and 4B illustrate the generation of 0-order diffraction 402 (e.g., specular reflection), −1-order diffraction 404, and −2-order diffraction 406. In one embodiment, various parameters of the illumination sub-system 106, the imaging sub-system 110, and the overlay target 202 are selected to provide that a single diffraction order is collected by the imaging sub-system 110 (e.g., the −1-order diffraction 404 as illustrated in FIGS. 4A and 4B). For example, the periodicity of features in the cell 206a as well as parameters associated with a measurement recipe such as, but not limited to, a wavelength of the first illumination beam 108a, an angle of incidence of the first illumination beam 108a, or a size of the collection pupil 302 may be selected to provide that a single diffraction order from the first illumination beam 108a passes through the collection pupil 302.

Figure 4C:
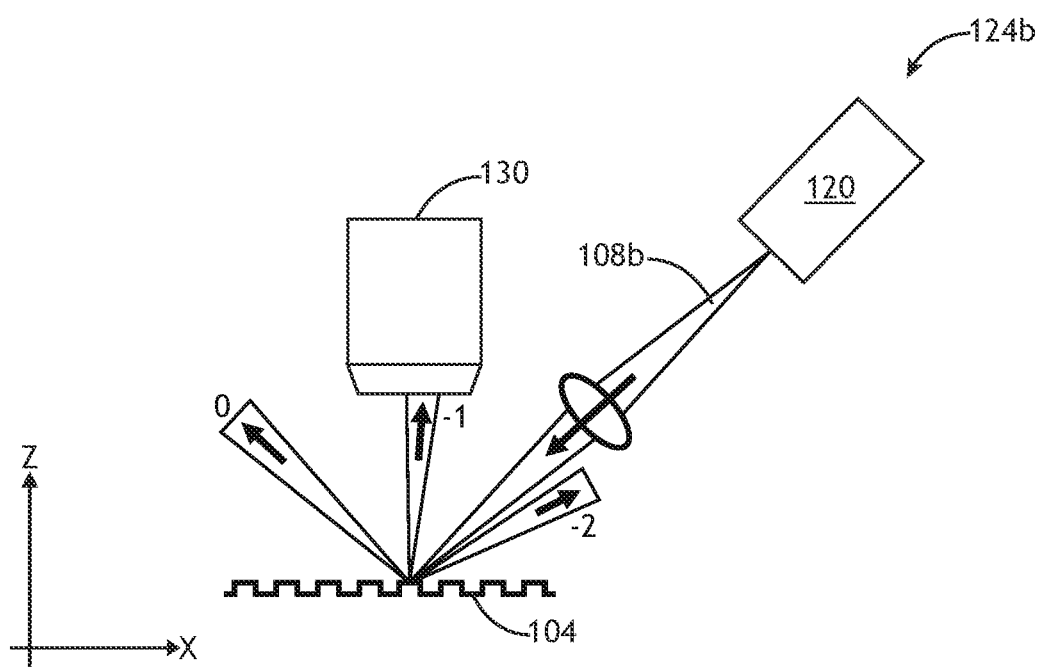
FIG. 4C is a schematic view of imaging a cell of the overlay target with the second illumination beam in FIG. 3 oriented along the X direction along an opposite azimuth angle as the first illumination beam in accordance with one or more embodiments of the present disclosure.
Figure 4D:
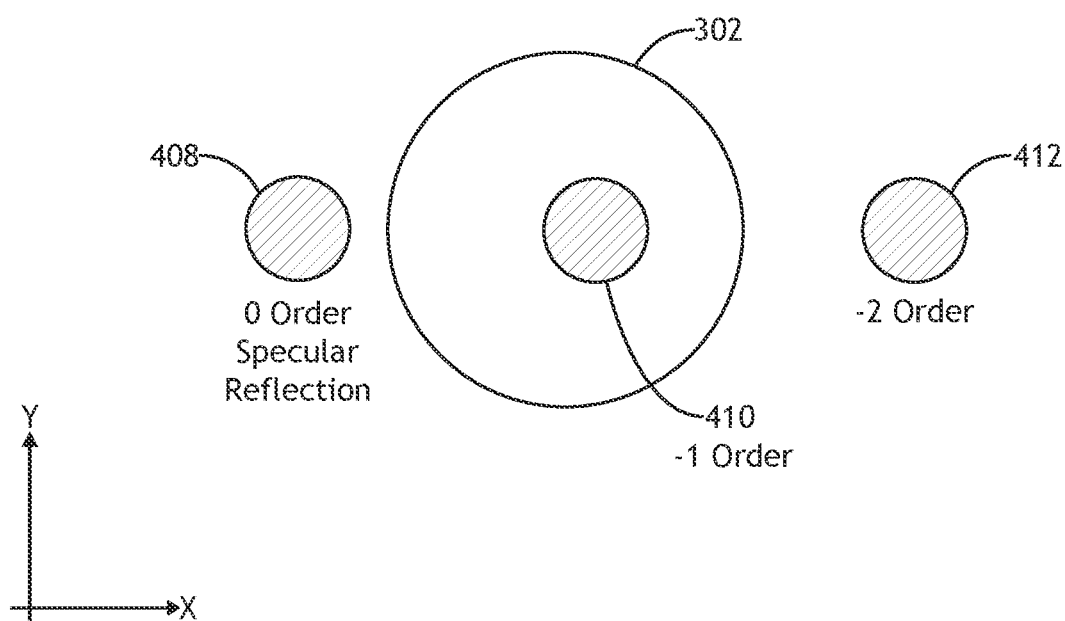
FIG. 4D is a schematic view of the collection pupil illustrating a distribution of diffraction orders of the third illumination beam generated by a cell in accordance with one or more embodiments of the present disclosure.

FIG. 4C is a schematic view of imaging the cell 206a of the overlay target 202 with the second illumination beam 108b in FIG. 3 oriented along the X direction along an opposite azimuth angle as the first illumination beam 108a in accordance with one or more embodiments of the present disclosure. FIG. 4D is a schematic view of the collection pupil 302 illustrating a distribution of diffraction orders of the second illumination beam 108b generated by the cell 206a in accordance with one or more embodiments of the present disclosure. FIGS. 4C and 4D similarly illustrate the generation of multiple diffraction orders along the X direction, which may be symmetric to the distribution of the diffraction orders of the first illumination beam 108a. In particular, FIGS. 4C and 4D illustrate the generation of 0-order diffraction 408 (e.g., specular reflection), −1-order diffraction 410, and −2-order diffraction 412. Similarly, FIGS. 4C and 4D illustrate the collection of a single diffraction order (here, the −1-order diffraction 410).

Figure 4E:
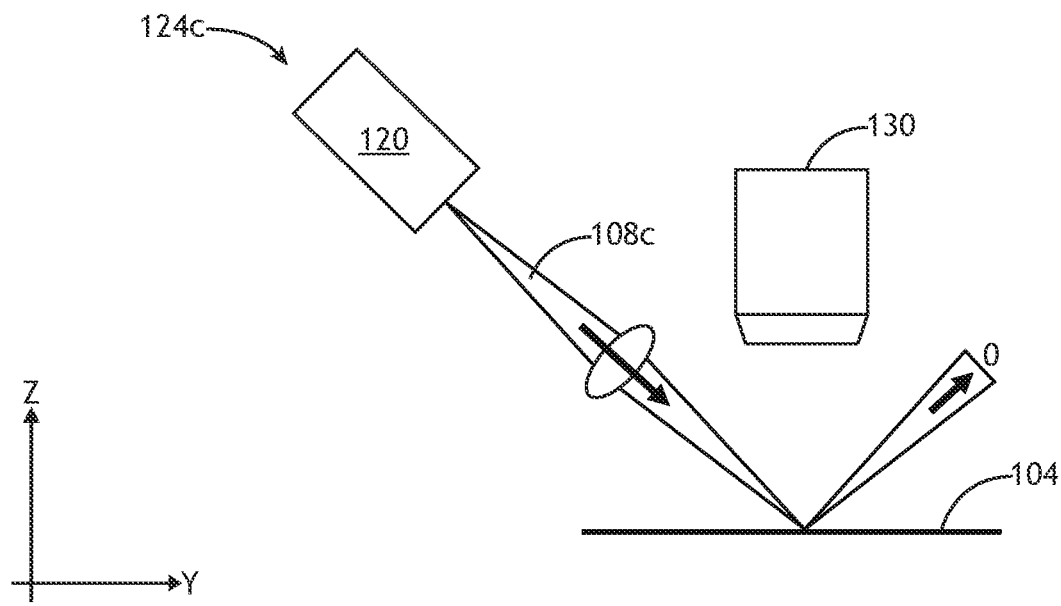
FIG. 4E is a schematic view of imaging a cell of the overlay target with the third illumination beam in FIG. 3 oriented along the Y direction in accordance with one or more embodiments of the present disclosure.
Figure 4F:
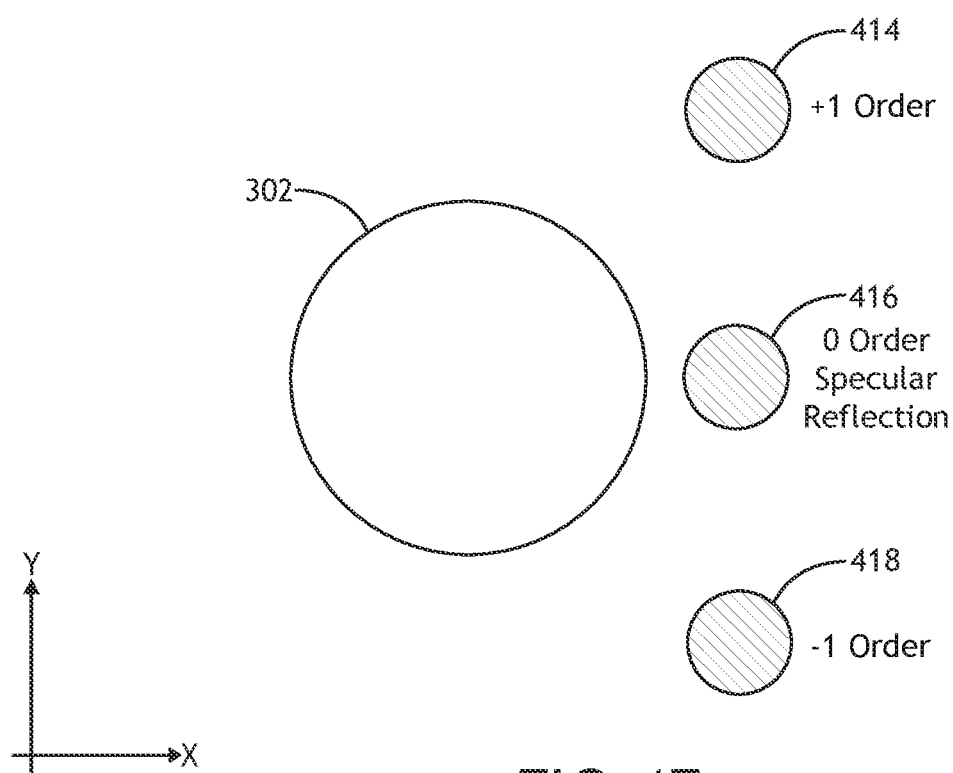
FIG. 4F is a schematic view of the collection pupil illustrating a distribution of diffraction orders of the third illumination beam generated by a cell in accordance with one or more embodiments of the present disclosure.

FIG. 4E is a schematic view of imaging the cell 206a of the overlay target 202 with the third illumination beam 108c in FIG. 3 oriented along the Y direction in accordance with one or more embodiments of the present disclosure. FIG. 4F is a schematic view of the collection pupil 302 illustrating a distribution of diffraction orders of the third illumination beam 108c generated by the cell 206a in accordance with one or more embodiments of the present disclosure.

As illustrated in FIGS. 4E and 4F, the cell 206a does not diffract the third illumination beam 108c along the Y direction, but only along the X direction (e.g., +1-order diffraction 414, 0-order diffraction 416 (e.g., specular reflection), and −1-order diffraction 418). Further, in one embodiment, various parameters of the illumination sub-system 106, the imaging sub-system 110, and the overlay target 202 are selected to provide that no diffraction orders (including 0-order diffraction) pass through the collection pupil 302. As a result, the features of the cell 206a will not be visible in an image of the overlay target 202 based on the third illumination beam 108c. Although not shown, it is to be understood that illumination of the cell 206a with the fourth illumination beam 108d will have a similar result as illumination with the third illumination beam 108c.

Further, it is to be understood that FIGS. 4A-4F may be illustrative of any cells 206 have structures that are periodic along the X direction (e.g., cell 206d). It is also to be understood that the concepts illustrated in FIGS. 4A-4F may further illustrate the imaging of cells having structures that are periodic along the Y direction (e.g., cell 206b and cell 206c). In particular, imaging the overlay target 202 with the third illumination beam 108c and the fourth illumination beam 108d may result in the collection of a single diffraction order generated by cell 206b and cell 206c and no light from cell 206a and cell 206d such that only cell 206b and cell 206c are visible.

Figure 5A:
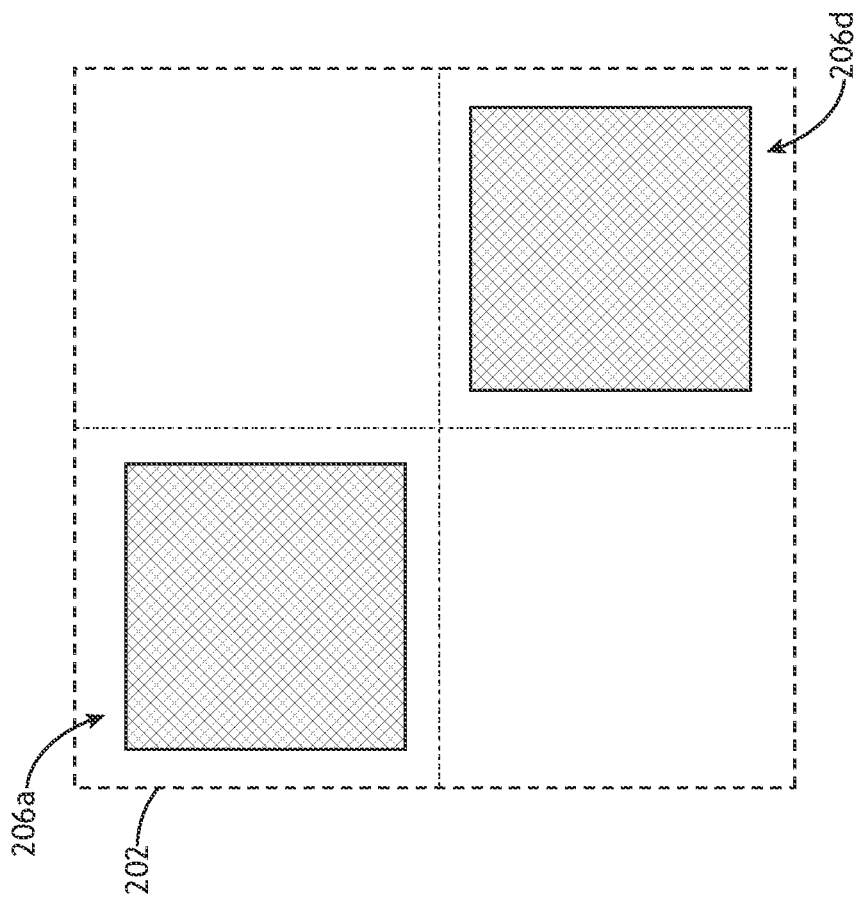
FIG. 5A is a conceptual view of an image of the overlay target based on illumination with the first illumination beam or the second illumination beam in accordance with one or more embodiments of the present disclosure.
Figure 5A:
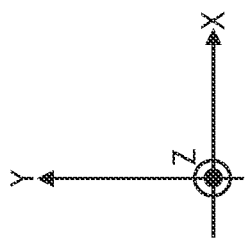
Figure 6:
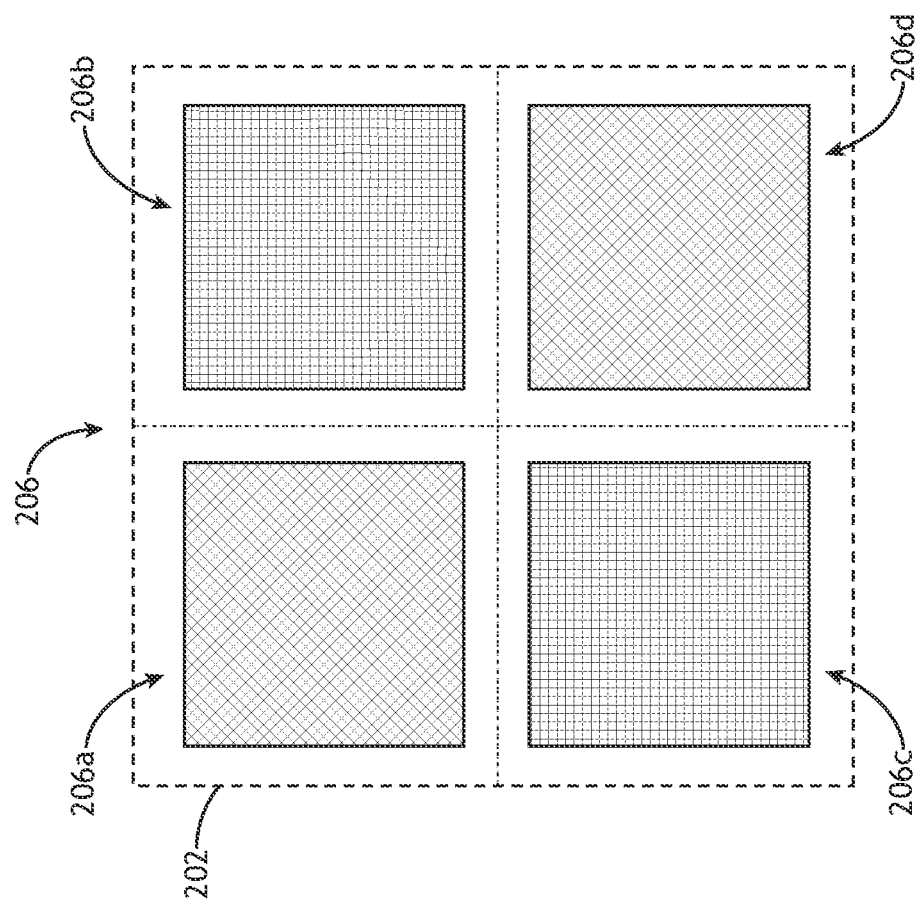
FIG. 6 is a conceptual view of an image of the overlay target based on illumination with either the first illumination beam and the third illumination beam or the second illumination beam and the fourth illumination beam in accordance with one or more embodiments of the present disclosure.
Figure 6:
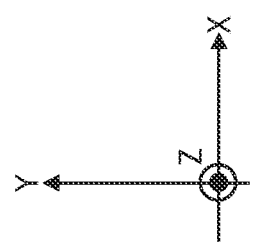

Referring now to FIGS. 5A-6, field-plane images of the overlay target 202 based on various illumination conditions are described in greater detail in accordance with one or more embodiments of the present disclosure. In one embodiment, as illustrated in FIGS. 5A-6, the overlay target 202 is fully illuminated by incident illumination. In this regard, the illumination directed to the overlay target 202 is larger than the size of the overlay target 202.

FIG. 5A is a conceptual view of an image of the overlay target 202 based on illumination with the first illumination beam 108a or the second illumination beam 108b in accordance with one or more embodiments of the present disclosure. As described with reference to FIGS. 4A-4F, illumination with the first illumination beam 108a or the second illumination beam 108b results in the collection of a single diffraction order (e.g., the −1-order diffraction 404 or the −1-order diffraction 410) generated by the structures that are periodic along the X direction (here, cell 206a and cell 206d) and the collection of no light from the structures that are periodic along the Y direction. As a result, only cell 206a and cell 206d are visible in an image, but the grating-over-grating features in those cells are not resolved and rather appear as monolithic features. It is further contemplated herein that the relative intensities of the visible cells in an image generated with the first illumination beam 108a compared to an image generated with the second illumination beam 108b may be indicative of overlay errors associated with relative displacements of the first layer 210 and the second layer 214 of the sample 104 along the X direction.

FIG. 5B is a conceptual view of an image of the overlay target 202 based on illumination with the third illumination beam 108c or the fourth illumination beam 108d in accordance with one or more embodiments of the present disclosure. In this configuration, only cell 206b and cell 206c are visible in an image. Further, an overlay measurement along the Y direction may be generated based on the relative intensities of the visible cells in an image generated with the third illumination beam 108c compared to an image generated with the fourth illumination beam 108d.

It is contemplated herein that overlay measurements associated with a relative displacement of the first layer 210 and the second layer 214 of the sample 104 may be generated using the images illustrated in FIGS. 5A and 5B. In particular, the relative intensities of the visible cells in an image generated with the first illumination beam 108a compared to an image generated with the second illumination beam 108b may be indicative of overlay errors along the X direction, while the relative intensities of the visible cells in an image generated with the third illumination beam 108c compared to an image generated with the fourth illumination beam 108d may be indicative of overlay errors along the Y direction.

Referring now to FIG. 6, in another embodiment, overlay measurements along the X and Y directions may be generated using two images, where each image is formed from a pair of two orthogonal illumination beams 108.

FIG. 6 is a conceptual view of an image of the overlay target 202 based on illumination with either the first illumination beam 108a and the third illumination beam 108c or the second illumination beam 108b and the fourth illumination beam 108d in accordance with one or more embodiments of the present disclosure. In this configuration, the image in FIG. 6 is formed using a pair of illumination beams 108 having orthogonal azimuth angles.

In FIG. 6, all of the cells 206a-d in the overlay target 202 are visible. However, as illustrated in FIGS. 4A-5D, an image of any particular cell 206 is formed from light associated with a single illumination beam 108. In this way, a pair of images such as those illustrated in FIG. 6 generated by opposing pairs of illumination beams 108 may include the same information as four images such as those illustrated in FIGS. 5A and 5B such that equivalent overlay measurements may be generated based on two images (and two corresponding measurement recipes) rather than four images (and four corresponding measurement recipes).

Referring now to FIGS. 7A-7E, generation of dark-field images with a split-pupil are described in greater detail in accordance with one or more embodiments of the present disclosure.

In one embodiment, the overlay metrology tool 102 includes a pupil-splitting optic such as, but not limited to, a prism located in a pupil plane 702 to selectively direct portions of the light in different portions of the collection pupil 302 to different detectors 134. For example, though not shown, the overlay metrology tool 102 illustrated in FIG. 1D may include a pupil-splitting optic within an aperture of the dark-field mirror 148 or in a conjugate pupil plane prior to the detector 134.

FIG. 7A is a conceptual view of a split pupil plane 702, in accordance with one or more embodiments of the present disclosure. In one embodiment, the pupil plane 702 is split into four quadrants, where two opposing illumination quadrants 704 provide for illumination with two opposing illumination beams 108 (e.g., a first diagonal illumination beam 108e and a second diagonal illumination beam 108f) and two opposing collection quadrants 706 provide for collection of sample light 132. Further, 0-order diffraction from the illumination beams 108 is blocked in the illumination quadrants 704 (e.g., by the dark-field mirror 148, or the like) to provide for dark-field imaging.

In another embodiment, as illustrated in FIGS. 7B-7E, the illumination beams 108 are oriented diagonally with respect to the measurement directions (e.g., the directions of periodicity of the various cells 206 of the overlay target 202).

FIG. 7B is a conceptual view of the pupil plane 702 illustrating the distribution of diffraction orders of the first diagonal illumination beam 108e by the cell 206b and cell 206c having periodicities in the Y direction in accordance with one or more embodiments of the present disclosure. In particular, FIG. 7B illustrates −1-order diffraction 708, 0-order diffraction 710, +1-order diffraction 712, and +2-order diffraction 714. FIG. 7C is a conceptual view of the pupil plane 702 illustrating the distribution of diffraction orders of the first diagonal illumination beam 108e by the cell 206a and cell 206d having periodicities in the X direction in accordance with one or more embodiments of the present disclosure. In particular, FIG. 7C illustrates −1-order diffraction 716, 0-order diffraction 718, +1-order diffraction 720, and +2-order diffraction 722. As illustrated by FIGS. 7B and 7C, a single diffraction order is collected from any given cell. As a result, this configuration may generate an image similar to FIG. 6.

FIG. 7D is a conceptual view of the pupil plane 702 illustrating the distribution of diffraction orders of the second diagonal illumination beam 108f by the cell 206b and cell 206c having periodicities in the Y direction in accordance with one or more embodiments of the present disclosure. In particular, FIG. 7D illustrates −1-order diffraction 724, 0-order diffraction 726, +1-order diffraction 728, and +2-order diffraction 730. FIG. 7E is a conceptual view of the pupil plane 702 illustrating the distribution of diffraction orders of the second diagonal illumination beam 108f by the cell 206a and cell 206d having periodicities in the X direction in accordance with one or more embodiments of the present disclosure. In particular, FIG. 7E illustrates −1-order diffraction 732, 0-order diffraction 734, +1-order diffraction 736, and +2-order diffraction 738. Similar to FIGS. 7B and 7C, FIGS. 7D and 7E illustrate the collection of a single diffraction order is collected from any given cell of the overlay target 202, but from the opposing second illumination beam 108f. As a result, this configuration may also generate an image similar to FIG. 6 and overlay may be determined using a similar technique as described above with respect to FIG. 6.

Referring again to FIGS. 1A-1D, configurations of the overlay metrology tool 102 for scanning or static metrology modes are described in greater detail in accordance with one or more embodiments of the present disclosure. Overlay metrology in scanning or static modes is generally described in U.S. patent application Ser. No. 16/586,504 filed on Sep. 27, 2019 and U.S. patent application Ser. No. 16/598,146 filed on Oct. 10, 2019, both of which are incorporated by reference in its entirety.

The overlay metrology tool 102 may include any type of optical detector 134 known in the art suitable for measuring illumination received from the sample 104. Further, the overlay metrology tool 102 may generally include any number of detectors 134.

In one embodiment, the overlay metrology tool 102 includes one or more sensors suitable for generating one or more images of the sample 104 while the sample 104 is in motion. For example, the detector 134 may include a line sensor including a row of pixels. In this regard, the system 100 may generate a continuous image (e.g., a strip image) one row at a time by translating the sample 104 in a scan direction perpendicular to the pixel row through a measurement field of view and continuously clocking the line sensor during a continuous exposure window. By way of another example, the detector 134 may include a time-domain integration (TDI) sensor including multiple pixel rows and a readout row. The TDI sensor may operate in a similar manner as the line sensor, except that clocking signals may successively move charge from one pixel row to the next until the charge reaches the readout row, where a row of the image is generated. By synchronizing the charge transfer (e.g., based on the clocking signals) to the motion of the sample along the scan direction, charge may continue to build up across the pixel rows to provide a relatively higher signal to noise ratio compared to the line sensor.

In another embodiment, the overlay metrology tool 102 includes one or more sensors suitable for generating one or more images of the sample 104 while the sample 104 is static. For example, the detector 134 may include a sensor suitable for generating one or more images of a static sample 104 such as, but is not limited to, a charge-coupled device (CCD), a complementary metal-oxide-semiconductor (CMOS) sensor, a photomultiplier tube (PMT) array, or an avalanche photodiode (APD) array. Further, the detector 134 may include a multi-tap sensor having two or more taps per pixel including, but not limited to, a multi-tap CMOS sensor. In this regard, charge in a multi-tap pixel may be directed to any selected tap during an exposure window based on one or more drive signals to the pixel. Accordingly, a multi-tap sensor including an array of multi-tap pixels may generate multiple images, each associated with different taps of the associated pixels, during a single readout phase. Further, for the purposes of the present disclosure, a tap of a multi-tap sensor may refer to an output tap connected to the associated pixels. In this regard, reading out each tap of a multi-tap sensor (e.g., in a readout phase) may generate a separate image.

In another embodiment, a detector 134 may include a spectroscopic detector suitable for identifying wavelengths of radiation emanating from the sample 104. In another embodiment, the system 100 may include multiple detectors 134 (e.g. associated with multiple beam paths generated by one or more beamsplitters to facilitate multiple metrology measurements by the system 100). For example, the system 100 may include one or more detector 134 suitable for static mode imaging and one or more detector 134 suitable for scanning mode imaging. In another embodiment, the system 100 may include one or more detector 134 suitable for both static and scanning imaging modes. For example, a TDI sensor may operate in a static mode by not clocking the TDI sensor to transfer charge between pixel rows during an exposure window. Then, once the exposure window is stopped (e.g., via a shutter, switching off the illumination source 120, or the like) and additional light is not incident on the pixels, the TDI sensor may be clocked to transfer the charge line by line to the readout row to generate an image having a length equal to the number of pixel rows.

It is further contemplated herein that various techniques may be used to generate separate images of the sample 104 (e.g., of an overlay target 202 on the sample 104) with opposing illumination beams 108 for an overlay measurement as disclosed herein.

In one embodiment, separate images of an overlay target 202 with opposing illumination beams 108 are generated by sequential images generated using sequential illumination of the sample 104 with the illumination beams 108. For example, sequential images in a scanning configuration may be generated by sequentially scanning the overlay target 202, where the overlay target 202 is illuminated with different illumination conditions (e.g., different illumination beams 108 in each scan). By way of another example, sequential images in a static configuration may be generated by sequentially illuminating and imaging the overlay target 202 with different illumination conditions while the overlay target 202 remains static in the overlay metrology tool 102.

In another embodiment, the overlay target 202 is alternately illuminated with different illumination conditions (e.g., different illumination beams 108) while the overlay target 202 is scanned through a measurement field of view of the overlay metrology tool 102 and an interleaved image of the overlay target 202 is generated based on the alternate illumination conditions. Separate images associated with the different illumination conditions may then be extracted from the interleaved images. In this regard, multiple separate images associated with multiple separate illumination conditions may be generated in a single scan, which may facilitate high-throughput scanning metrology.

Figure 8:
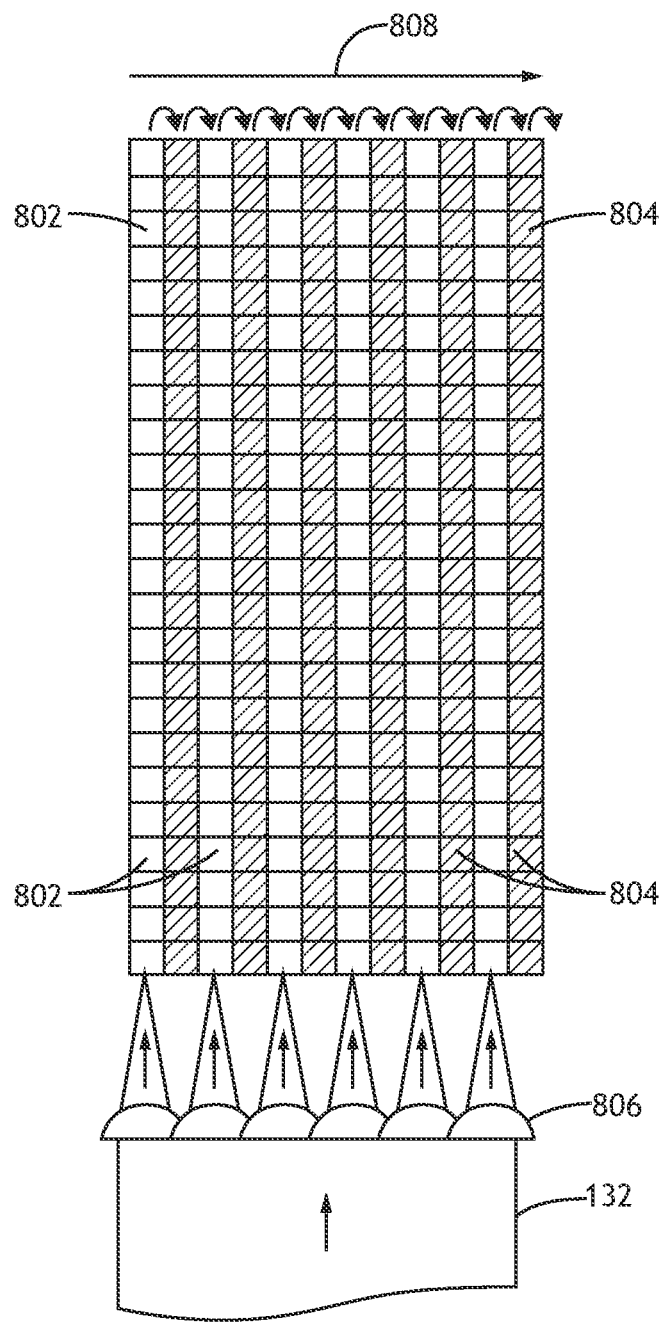
FIG. 8 is a conceptual view of the imaging sub-system configured to generate an interleaved image using a detector including a TDI sensor from two alternating illumination conditions in accordance with one or more embodiments of the present disclosure.

For example, an interleaved image may be generated using a detector 134 including a TDI sensor in a scanning mode by selectively illuminating alternating pixel rows 802 of the TDI sensor (e.g., every other pixel row for two alternating illumination conditions, every fourth row for four alternating illumination conditions, every Nth row for N alternating illumination conditions, or the like) with sample light 132. In this regard, the image of the overlay target 202 is distributed across the selected rows, while intervening rows 804 are unilluminated. Selectively alternating illumination of the alternating pixels rows 802 may be performed using a variety of techniques including, but not limited to, a cylindrical lens array or a slit array positioned to block the intervening rows 804. FIG. 8 is a conceptual view of the imaging sub-system 110 configured to generate an interleaved image using a detector 134 including a TDI sensor from two alternating illumination conditions in accordance with one or more embodiments of the present disclosure. The selected imaging onto alternating rows may be accomplished using any suitable combination of optical elements including, but not limited to, a cylindrical lens array 806 as illustrated in FIG. 8.

Additionally, the charge transfer rate of the TDI sensor along a scan direction 808 may be synchronized with the rate of switching the illumination sub-system 106. For example, in the case of two alternating illumination conditions (e.g., illumination beams 108 suitable for forming images such as those illustrated in FIG. 6), the TDI sensor may be clocked to allow for charge buildup in the pixel rows 802 with a first illumination condition, then clocked to transfer the charge to the intervening rows 804 while the pixel rows 802 are illuminated with a second illumination configuration. This process may then repeat such that alternating rows of an image (e.g., an interleaved image) correspond to the alternating illumination conditions. Separated images associated with each of the illumination conditions may then be extracted from alternating rows.

By way of another example, efficient capture of images of the overlay target 202 using alternating illumination conditions in a static mode may be obtained using a multi-tap imaging sensor as described previously herein. In this regard, charge in each pixel may be directed to any selected tap during an exposure window based on one or more drive signals to the pixel. A multi-tap sensor including an array of multi-tap pixels may generate multiple images, each associated with different taps of the associated pixels, during a single readout phase. Accordingly, the system 100 may perform a static mode measurement by sequentially providing any selected number of optical configurations during the exposure window while the sample 104 is static.

Figure 9:
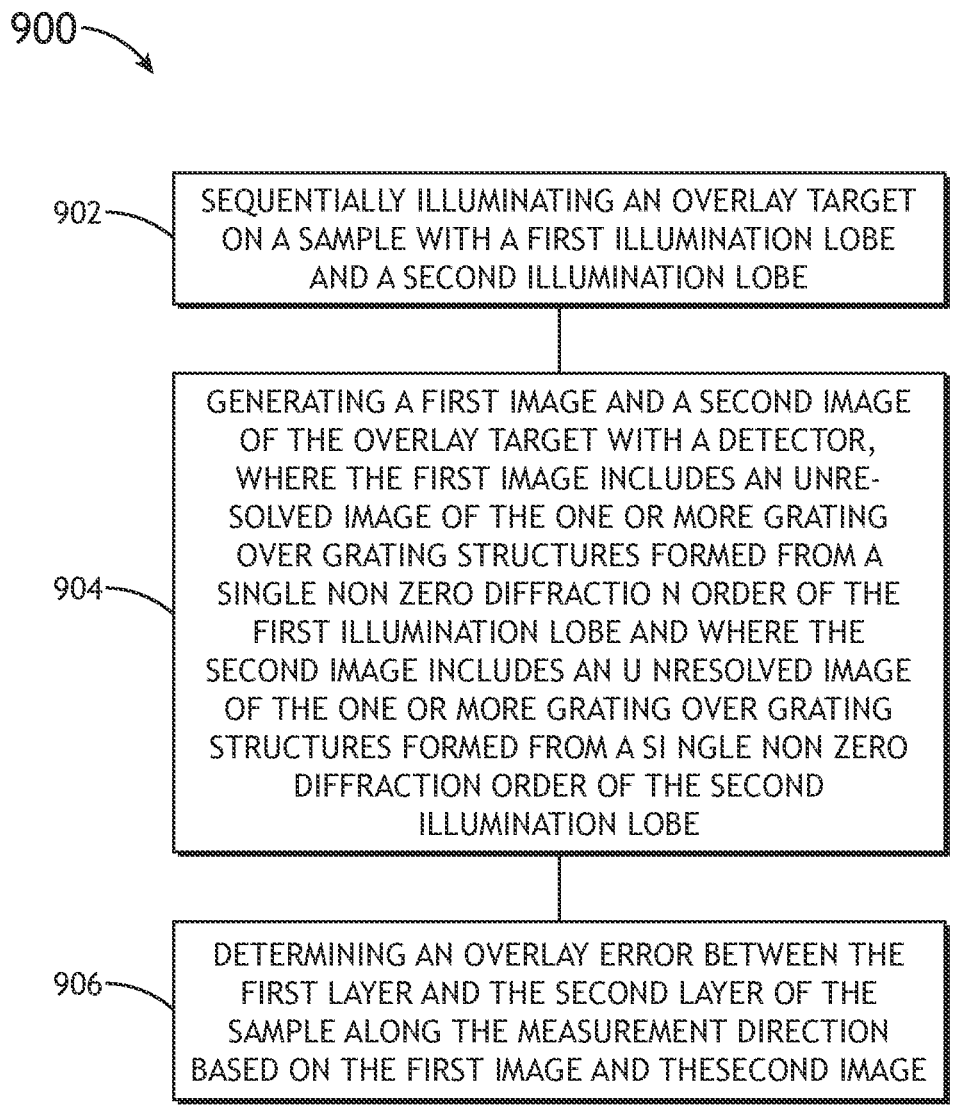
FIG. 9 is a flow diagram illustrating steps performed in an overlay method in accordance with one or more embodiments of the present disclosure.

FIG. 9 is a flow diagram illustrating steps performed in an overlay method 900 in accordance with one or more embodiments of the present disclosure. Applicant notes that the embodiments and enabling technologies described previously herein in the context of the system 100 should be interpreted to extend to the method 900. It is further noted, however, that the method 900 is not limited to the architecture of the system 100.

In one embodiment, the method 900 includes a step 902 of sequentially illuminating an overlay target on a sample with a first illumination lobe and a second illumination lobe. For example, the overlay target may include one or more grating-over-grating features formed from periodic structures on a first sample layer and a second sample layer, where the one or more grating-over-grating structures are periodic along a measurement direction as illustrated in FIG. 2. Further, the overlay target may generally include multiple sets of cells including grating-over-grating features along multiple measurement directions to facilitate overlay measurements along the multiple measurement directions. In this case, the step 902 may include sequentially illuminating the overlay target with two illumination conditions, where a first illumination condition includes a first pair of illumination lobes including one illumination lobe along each the first and second directions, and where a second illumination condition includes a second pair of illumination lobes opposed to the first pair of illumination lobes (e.g., at opposing azimuth angles).

In another embodiment, the method 900 includes a step 904 of generating a first image and a second image of the overlay target with a detector, where the first image includes an unresolved image of the one or more grating-over-grating structures formed from a single non-zero diffraction order of the first illumination lobe and where the second image includes an unresolved image of the one or more grating-over-grating structures formed from a single non-zero diffraction order of the second illumination lobe. In the case that the overlay target includes multiple sets of cells having grating-over-grating structures that are periodic along the multiple measurement directions, the first and second images may include unresolved images of all of the cells, but images of each cell may be generated based on a single diffraction order from a single illumination lobe.

In another embodiment, the method 900 includes a step 906 of determining an overlay error between the first layer and the second layer of the sample along the measurement direction based on the first image and the second image. In particular, overlay may be proportional to differences in intensity of a particular grating-over-grating structure in the first and second images.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of couplable include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An overlay metrology system comprising:
    an illumination sub-system configured to sequentially illuminate an overlay target on a sample with a first illumination lobe and a second illumination lobe opposite the first illumination lobe, wherein the overlay target includes one or more grating-over-grating features formed from periodic structures on a first sample layer and a second sample layer, wherein the one or more grating-over-grating structures are periodic along a measurement direction;
    an imaging sub-system comprising:
        an objective lens; and
        a detector configured to generate a first image and a second image of the overlay target, wherein the first image includes an unresolved image of the one or more grating-over-grating structures formed from a single non-zero diffraction order of the first illumination lobe generated by the one or more grating-over-grating structures along the measurement direction, wherein the second image includes an unresolved image of the one or more grating-over-grating structures formed from a single non-zero diffraction order of the second illumination lobe generated by the one or more grating-over-grating structures along the measurement direction; and
    a controller communicatively coupled to the detector, the controller including one or more processors configured to execute program instructions causing the one or more processors to determine an overlay error between the first sample layer and the second sample layer of the sample along the measurement direction based on the first image and the second image.

2. The overlay metrology system of claim 1, wherein determine an overlay error between the first sample layer and the second sample layer of the sample along the measurement direction based on the first image and the second image comprises:
    determine an overlay error between the first sample layer and the second sample layer of the sample along the measurement direction based on a difference in intensity of the one or more grating-over-grating structures in the first and second images.

3. The overlay metrology system of claim 1, wherein the illumination sub-system includes one or more illumination lenses configured to illuminate the overlay target with the first and second illumination lobes at numerical apertures outside a numerical aperture of the objective lens.

4. The overlay metrology system of claim 1, wherein the illumination sub-system directs the first and second illumination lobes to the sample through the objective lens, wherein the imaging sub-system further includes one or more beam blocks to block specular reflection associated with the first and second illumination lobes.

5. The overlay metrology system of claim 4, wherein the one or more beam blocks comprise:
    a dark-field stop in the imaging sub-system.

6. The overlay metrology system of claim 4, further comprising:
    a dark-field mirror common to the illumination sub-system and the imaging sub-system, wherein the dark-field mirror directs the first and second illumination lobes to the overlay target through the objective lens, wherein the dark-field mirror operates as the one or more beam blocks to block the specular reflection of the first and second illumination lobes, wherein the dark-field mirror passes the single non-zero diffraction orders associated with the first and second illumination lobes.

7. The overlay metrology system of claim 6, wherein the dark-field mirror comprises:
an annular mirror.

8. The overlay metrology system of claim 1, wherein the detector comprises:
a scanning detector configured to generate the first and second images while the sample is translated through a measurement field of the objective lens by a translation stage.

9. The overlay metrology system of claim 8, wherein the detector comprises:
a time domain integration (TDI) sensor.

10. The overlay metrology system of claim 9, further comprising:
a cylindrical lens array configured to direct light emanating from the sample to every Nth pixel row of the TDI sensor, wherein the overlay metrology system is configured to perform a scanning mode measurement by:
translating the sample at a charge transfer rate of the TDI sensor;
alternately illuminating the sample with the first and second illumination lobes, wherein a switching time between successive optical configurations of the imaging sub-system corresponds to the charge transfer rate of the TDI sensor;
generating, with the TDI sensor, an interleaved image including the first and second images during an exposure window; and
separating the interleaved image into the first and second images.

11. The overlay metrology system of claim 10, further comprising:
a slit array positioned to block pixel rows of the TDI sensor not illuminated by the cylindrical lens array.

12. The overlay metrology system of claim 1, wherein the detector comprises:
a static imaging detector configured to generate the first and second images while the sample is static in a measurement field of the objective lens by a translation stage.

13. The overlay metrology system of claim 1, wherein at least one of the first illumination lobe or the second illumination lobe comprises:
an incoherent illumination beam.

14. The overlay metrology system of claim 13, wherein the incoherent illumination beam comprises:
a speckle-busted laser beam.

15. An overlay metrology system comprising:
an illumination sub-system configured to provide a first pair of opposing illumination lobes along a first measurement direction and a second pair of illumination lobes along a second measurement direction orthogonal to the first measurement direction, wherein the illumination sub-system is further configured to sequentially illuminate an overlay target on a sample with first and second illumination configurations, the first illumination configuration including one illumination lobe from each of the first and second pairs of opposing illumination lobes, the second illumination configuration including a remaining illumination lobe from each of the first and second pairs of illumination lobes, wherein the overlay target comprises:
a first set of one or more cells including one or more grating-over-grating features formed from periodic structures on a first sample layer and a second sample layer, wherein the one or more grating-over-grating structures are periodic along the first measurement direction; and
a second set of one or more cells including one or more grating-over-grating features formed from periodic structures on the first sample layer and the second sample layer, wherein the one or more grating-over-grating structures are periodic along the second measurement direction;
an imaging sub-system comprising:
an objective lens; and
a detector configured to generate a first image and a second image of the overlay target, wherein the first image is formed with a single non-zero diffraction order from each illumination lobe in the first illumination configuration, wherein the second image is formed with a single non-zero diffraction order from each illumination lobe in the second illumination configuration; and
a controller communicatively coupled to the detector, the controller including one or more processors configured to execute program instructions causing the one or more processors to determine an overlay error between the first sample layer and the second sample layer of the sample along the first and second measurement directions based on the first and second images.

16. The overlay metrology system of claim 15, wherein determine an overlay error between the first sample layer and the second sample layer of the sample along the first and second measurement directions based on the first image and the second image comprises:
determine an overlay error between the first sample layer and the second sample layer of the sample along the first measurement direction based on a difference in intensity of the first set of one or more cells in the first and second images; and
determine an overlay error between the first sample layer and the second sample layer of the sample along the second measurement direction based on a difference in intensity of the second set of one or more cells in the first and second images.

17. The overlay metrology system of claim 15, wherein the illumination sub-system includes one or more illumination lenses configured to illuminate the overlay target with the first and second illumination lobes at numerical apertures outside a numerical aperture of the objective lens.

18. The overlay metrology system of claim 15, wherein the illumination sub-system directs the first and second illumination configurations to the sample through the objective lens, wherein the imaging sub-system further includes one or more beam blocks to block specular reflection associated with illumination lobes in the first and second illumination configurations.

19. The overlay metrology system of claim 18, wherein the one or more beam blocks comprise:
a dark-field stop in the imaging sub-system.

20. The overlay metrology system of claim 18, further comprising:
a dark-field mirror common to the illumination sub-system and the imaging sub-system, wherein the dark-field mirror directs the first and second illumination configurations to the overlay target through the objective lens, wherein the dark-field mirror operates as the one or more beam blocks to block the specular reflection of the illumination lobes in the first and second illumination configurations, wherein the dark-field mirror passes single diffraction orders associated with the illumination lobes in the first and second illumination configurations.

21. The overlay metrology system of claim 20, wherein the dark-field mirror comprises:
an annular mirror.

22. The overlay metrology system of claim 15, wherein the detector comprises:
a scanning detector configured to generate the first and second images while the sample is translated through a measurement field of the objective lens by a translation stage.

23. The overlay metrology system of claim 22, wherein the detector comprises:
a time domain integration (TDI) sensor.

24. The overlay metrology system of claim 23, further comprising:
a cylindrical lens array configured to direct light emanating from the sample to every Nth pixel row of the TDI sensor,
wherein the overlay metrology system is configured to perform a scanning mode measurement by:
translating the sample at a charge transfer rate of the TDI sensor;
alternately illuminating the sample with the first and second illumination lobes, wherein a switching time between successive optical configurations of the imaging sub-system corresponds to the charge transfer rate of the TDI sensor;
generating, with the TDI sensor, an interleaved image including the first and second images during an exposure window; and
separating the interleaved image into the first and second images.

25. The overlay metrology system of claim 24, further comprising:
a slit array positioned to block pixel rows of the TDI sensor not illuminated by the cylindrical lens array.

26. The overlay metrology system of claim 15, wherein the detector comprises:
a static imaging detector configured to generate the first and second images while the sample is static in a measurement field of the objective lens by a translation stage.

27. The overlay metrology system of claim 15, wherein at least one of the first illumination lobe or the second illumination lobe comprises:
an incoherent illumination beam.

28. The overlay metrology system of claim 27, wherein the incoherent illumination beam comprises:
a speckle-busted laser beam.

29. An overlay metrology method comprising:
sequentially illuminating an overlay target on a sample with a first illumination lobe and a second illumination lobe, wherein the overlay target includes one or more grating-over-grating features formed from periodic structures on a first sample layer and a second sample layer, wherein the one or more grating-over-grating structures are periodic along a measurement direction;
generating a first image and a second image of the overlay target with a detector, wherein the first image includes an unresolved image of the one or more grating-over-grating structures formed from a single non-zero diffraction order of the first illumination lobe from the one or more grating-over-grating structures along the measurement direction, wherein the second image includes an unresolved image of the one or more grating-over-grating structures formed from a single non-zero diffraction order of the second illumination lobe generated by the one or more grating-over-grating structures along the measurement direction; and
determining an overlay error between the first sample layer and the second sample layer of the sample along the measurement direction based on the first image and the second image.

* * * * *